US011152234B2

(12) United States Patent
Konishi et al.

(10) Patent No.: US 11,152,234 B2
(45) Date of Patent: Oct. 19, 2021

(54) WEIGHING APPARATUS, SUBSTRATE LIQUID PROCESSING APPARATUS, WEIGHING METHOD, SUBSTRATE LIQUID PROCESSING METHOD AND RECORDING MEDIUM

(71) Applicant: Tokyo Electron Limited, Tokyo (JP)

(72) Inventors: Teruaki Konishi, Koshi (JP); Kazusige Sano, Koshi (JP); Koji Tanaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 53 days.

(21) Appl. No.: 15/940,036

(22) Filed: Mar. 29, 2018

(65) Prior Publication Data

US 2018/0286718 A1 Oct. 4, 2018

(30) Foreign Application Priority Data

Mar. 30, 2017 (JP) .............................. JP2017-067562
Jan. 23, 2018 (JP) .............................. JP2018-008999

(51) Int. Cl.
*H01L 21/67* (2006.01)
*G01N 5/00* (2006.01)
(Continued)

(52) U.S. Cl.
CPC ........ *H01L 21/67242* (2013.01); *G01F 11/00* (2013.01); *G01G 5/00* (2013.01); *G01N 5/00* (2013.01); *H01L 21/67028* (2013.01); *H01L 21/67034* (2013.01); *H01L 21/67057* (2013.01); *H01L 21/67075* (2013.01); *H01L 21/67086* (2013.01); *H01L 21/67173* (2013.01);
(Continued)

(58) Field of Classification Search
CPC .......... B67D 7/0266; B67D 7/16; B67D 7/30; B67D 7/301; B67D 7/36; B05B 1/36; B05B 1/3026; G01G 5/00; G01G 17/04; G01G 17/06; H01L 21/67242; H01L 21/67075; H01L 21/67173; H01L 21/67017; H01L 21/67207
See application file for complete search history.

(56) References Cited

U.S. PATENT DOCUMENTS 2,127,732 A * 8/1938 Heitman ................ F25D 31/002
165/160
2,601,869 A * 7/1952 Harris ...................... D01F 2/08
137/413
(Continued)

FOREIGN PATENT DOCUMENTS

JP      2016-046265 A    4/2016

*Primary Examiner* — Parviz Hassanzadeh
*Assistant Examiner* — Margaret D Klunk
(74) *Attorney, Agent, or Firm* — Pearne & Gordon LLP

(57) ABSTRACT

A processing liquid used in a substrate liquid processing apparatus can be supplied in a constant amount with high accuracy. A substrate liquid processing apparatus A1 includes a storage line 61 configured to store a processing liquid therein; an introduction line 62 configured to introduce the processing liquid into the storage line 61; a discharge line 63 configured to discharge the processing liquid from the storage line 61; and a gas supply unit 65 configured to perform a strickling of the processing liquid by jetting a gas to a surface of the processing liquid stored in the storage line 61.

14 Claims, 17 Drawing Sheets

(51) Int. Cl.
    *G01F 11/00*     (2006.01)
    *H01L 21/677*     (2006.01)
    *G01G 5/00*     (2006.01)
    *G01F 11/28*     (2006.01)

(52) U.S. Cl.
    CPC .. *H01L 21/67253* (2013.01); *H01L 21/67718* (2013.01); *G01F 11/284* (2013.01); *H01L 21/67017* (2013.01); *H01L 21/67207* (2013.01)

(56) References Cited

U.S. PATENT DOCUMENTS

| | | | | |
|---|---|---|---|---|
| 3,583,437 | A * | 6/1971 | Mastroianni | G03D 3/06 137/558 |
| 5,480,063 | A * | 1/1996 | Keyes | G01F 11/284 137/563 |
| 6,712,239 | B2 * | 3/2004 | Schell | B01F 3/088 222/424.5 |
| 7,757,891 | B2 * | 7/2010 | Han | G01F 11/284 222/64 |
| 2002/0085447 | A1 * | 7/2002 | Snyder | B01F 15/00227 366/136 |
| 2013/0255882 | A1 * | 10/2013 | Takahashi | H01L 21/30604 156/345.15 |

\* cited by examiner

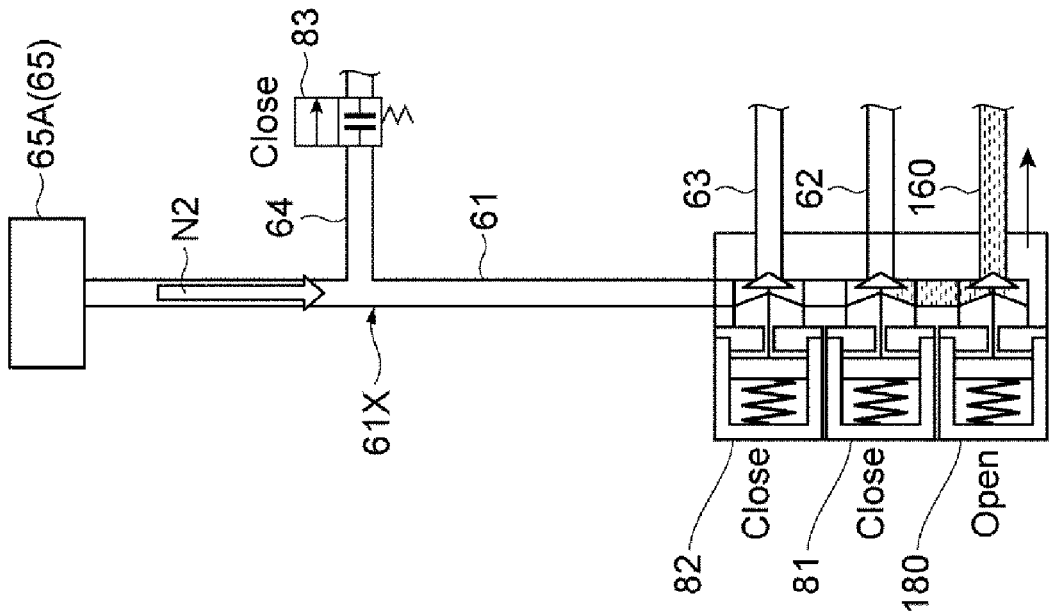
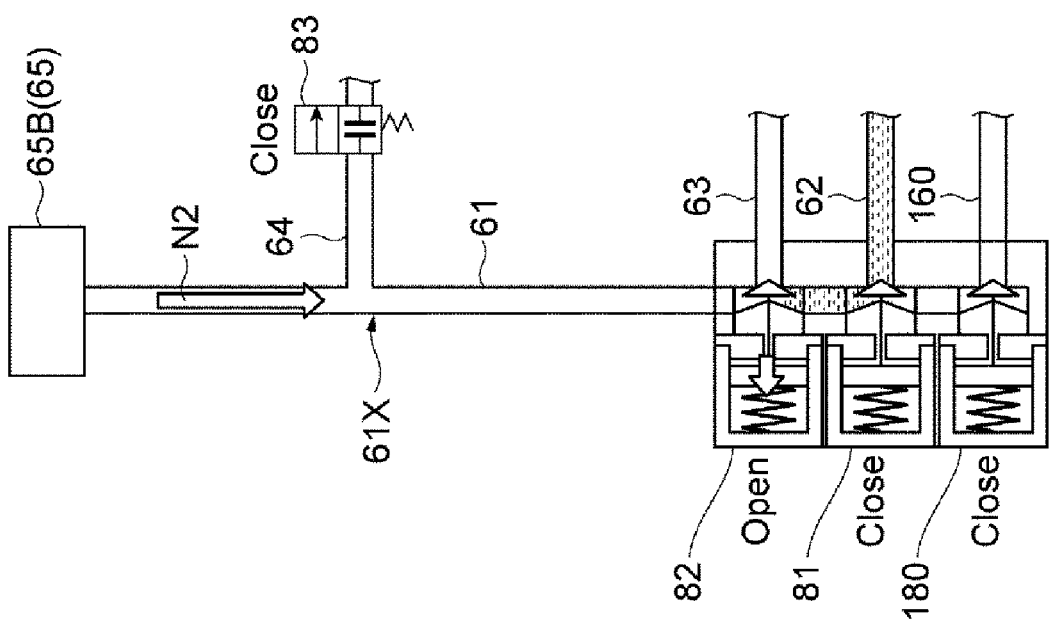

WEIGHING APPARATUS, SUBSTRATE LIQUID PROCESSING APPARATUS, WEIGHING METHOD, SUBSTRATE LIQUID PROCESSING METHOD AND RECORDING MEDIUM

CROSS-REFERENCE TO RELATED APPLICATION

This application claims the benefit of Japanese Patent Application Nos. 2017-067562 and 2018-008999 filed on Mar. 30, 2017 and Jan. 23, 2018, the entire disclosures of which are incorporated herein by reference.

TECHNICAL FIELD

The embodiments described herein pertain generally to a weighing apparatus, a substrate liquid processing apparatus, a weighing method, a substrate liquid processing method, and a recording medium.

BACKGROUND

Patent Document 1 describes a silicon concentration measuring apparatus configured to measure a silicon concentration of a phosphoric acid solution which is repeatedly used in an etching processing of a semiconductor. In the present apparatus, the silicon concentration is calculated by measuring the number of fine particles per unit amount of a liquid containing the phosphoric acid solution.

Patent Document 1: Japanese Patent Laid-open Publication No. 2016-046265

SUMMARY

In the silicon concentration measuring apparatus described in Patent Document 1, the phosphoric acid solution force-fed by a pump is supplied to a measuring device configured to measure the number of the fine particles of the liquid. Here, since a small amount of the phosphoric acid solution is diluted to be supplied to the measuring device, high reproduction accuracy for a dilution ratio is required to measure the silicon concentration accurately. In this regard, in a substrate liquid processing, for example, it may be required to weigh a small amount of a processing liquid with high accuracy.

In view of the foregoing, an exemplary embodiment provides a technique of weighing a small amount of a processing liquid with high accuracy.

In one exemplary embodiment, there is provided a substrate liquid processing apparatus including a storage unit configured to store a processing liquid therein; an introduction unit configured to introduce the processing liquid into the storage unit; a discharge unit configured to discharge the processing liquid from the storage unit; and a gas supply unit configured to perform an excess target storage amount removal of the processing liquid by jetting a gas to a surface of the processing liquid stored in the storage unit.

According to the exemplary embodiment, the small amount of the processing liquid can be weighed accurately.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5A to FIG. 5D specifically show the silicon concentration measuring unit in a storage processing, in a strickling processing; in a liquid feeding processing and after a liquid feed control, respectively;

FIG. 15A and FIG. 15B are diagrams schematically illustrating a variation of the pipeline configuration;

DETAILED DESCRIPTION

Figure 1:
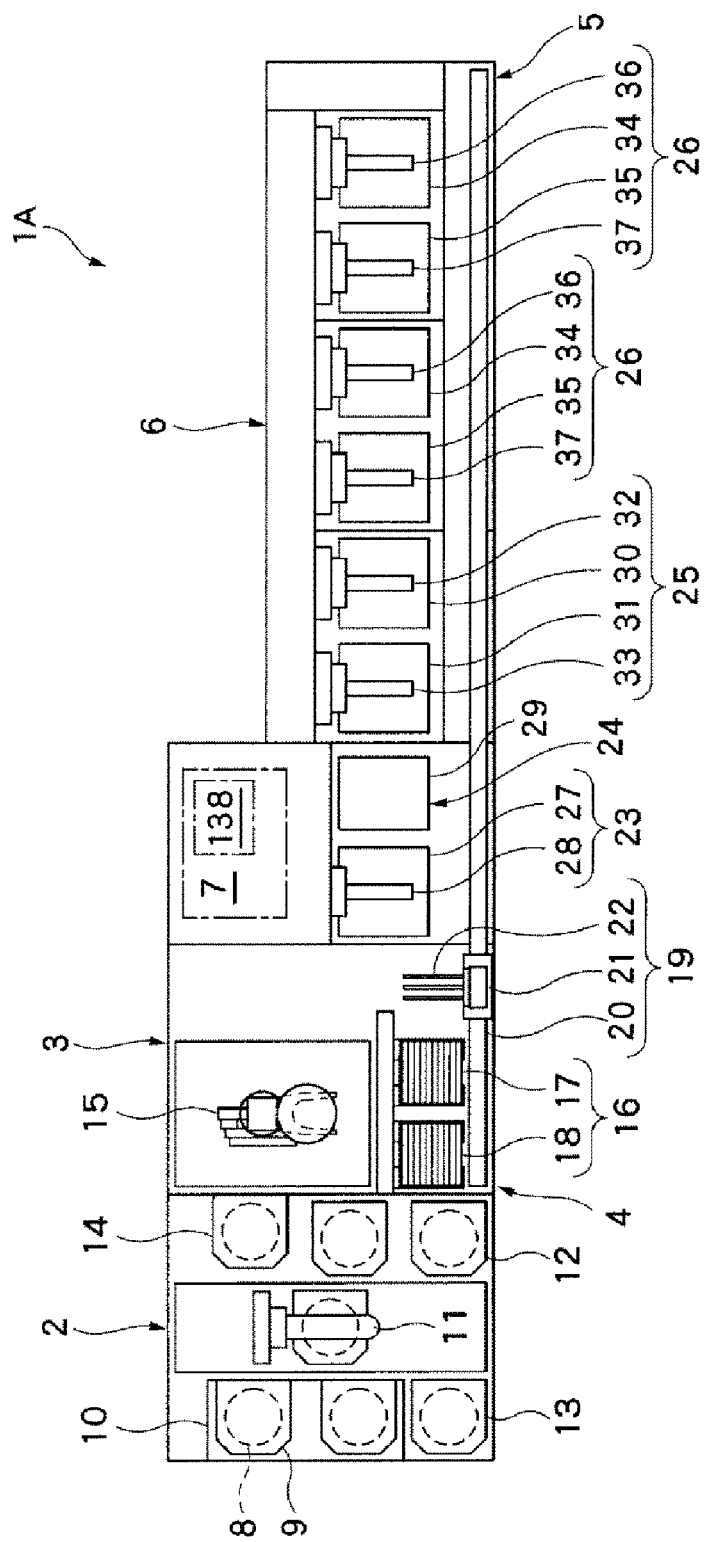
FIG. 1 is a plan view schematically illustrating a substrate liquid processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the description, same parts or parts having same function will be assigned same reference numerals, and redundant description will be omitted.

As illustrated in FIG. 1, the substrate liquid processing system 1A includes a carrier carry-in/out unit 2; a lot forming unit 3, a lot placing unit 4, a lot transferring unit 5, a lot processing unit 6 and a control unit 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture.

The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily places therein a substrate 8 to become a product before being processed by the lot processing unit 6. Further, the carrier stock 13 temporarily places therein the substrate 8 to become a product after being processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9, which is placed on the carrier placing table 14, to the carrier stock 13 or the carrier stage 10 by using the carrier transfer device 11. The carrier 9 transferred to the carrier stage 10 is carried to the outside.

The lot forming unit 3 forms a lot composed of a multiple number (e.g., 50 sheets) of substrates 8 to be processed at the same time which are combined with substrates 8 accommodated in one or multiple carriers 9. Further, when forming the lot, the substrates 8 may be arranged such that surfaces thereof having patterns formed thereon face each other or such that the surfaces thereof having the patterns formed thereon all face to one direction.

The lot forming unit 3 is equipped with a substrate transfer device 15 configured to transfer a plurality of substrates 8. Further, the substrate transfer device 15 is capable of changing a posture of the substrates 8 from a horizontal posture to a vertical posture and from the vertical posture to the horizontal posture while transferring the substrates 8.

In the lot forming unit 3, the substrates 8 are transferred into the lot placing unit 4 from the carrier 9 placed on the carrier placing table 14 by using the substrate transfer device 15, and the substrates 8 forming the lot are placed in the lot placing unit 4. Further, in the lot forming unit 3, the lot placed in the lot placing unit 4 is transferred into the carrier 9 placed on the carrier placing table 14 by the substrate transfer device 15. Further, the substrate transfer device 15 is equipped with, as a substrate supporting unit configured to support the multiple number of substrates 8, two types of substrate supporting unit, that is, a before-processed substrate supporting unit configured to support the substrates 8 before being subjected to a processing (that is, before being transferred by the lot transferring unit 5); and an after-processed substrate supporting unit configured to support the processed substrates 8 (after being transferred by the lot transferring unit 5). Accordingly, particles or the like adhering to the substrates 8 before being processed may be suppressed from adhering to the substrates 8 after being processed.

In the lot placing unit 4, the lot transferred between the lot forming unit 3 and the lot processing unit 6 by the lot transferring unit 5 is temporarily placed (stands by) on the lot placing table 16.

The lot placing unit 4 is equipped with a carry-in side lot placing table 17 configured to place thereon the lot before being processed (before being transferred by the lot transferring unit 5); and a carry-out side lot placing table 18 configured to place thereon the lot after being processed (after being transferred by the lot transferring unit 5). On each of the carry-in side lot placing table 17 and the carry-out side lot placing table 18, the multiple number of substrates 8 corresponding to the single lot are arranged in a forward-backward direction with the vertical posture.

In the lot placing unit 4, the lot formed in the lot forming unit 3 is placed on the carry-in side lot placing table 17, and this lot is carried into the lot processing unit 6 through the lot transferring unit 5. Further, in the lot placing unit 4, the lot carried out of the lot processing unit 6 through the lot transferring unit 5 is placed on the carry-out side lot placing table 18, and this lot is transferred into the lot forming unit 3.

The lot transferring unit 5 is configured to transfer the lot between the lot placing unit 4 and the lot processing unit 6 and within the lot processing unit 6.

The lot transferring unit 5 is equipped with the lot transfer device 19 configured to transfer the lot. The lot transfer device 19 includes a rail 20 extended along the lot placing unit 4 and the lot processing unit 6; and a moving body 21 configured to be moved along the rail 20 while holding the multiple number of substrates 8. The moving body 21 is provided with a substrate holding body 22 for holding the multiple number of substrates 8 arranged in the forward-backward direction with the vertical posture, and the substrate holding body 22 is configured to be movable forward and backward.

The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18. Further, the lot transferring unit 5 also performs the transfer of the lot within the lot processing unit 6 by using the lot transfer device 19.

The lot processing unit 6 is configured to perform a processing such as etching, cleaning and drying on the single lot composed of the substrates 8 arranged in the forward-backward direction with the vertical posture.

The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 25 configured to perform a cleaning processing on the substrates 8; and two etching apparatuses 26 according to the exemplary embodiment, each of which is configured to perform an etching processing on the substrates 8.

The drying apparatus 23 is equipped with a processing tub 27; and a substrate elevating device 28 provided at the processing tub 27 and configured to be moved up and down. A processing gas for drying (IPA (isopropyl alcohol) or the like) is supplied into the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 with the substrate elevating device 28, and moves the received lot up and down with the substrate elevating device 28, so that a drying processing of the substrates 8 is performed with the processing gas for drying supplied into the processing tub 27. Further, the drying apparatus 23 delivers the lot to the substrate holding body 22 of the lot transfer device 19 from the substrate elevating device 28.

The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, a cleaning processing on the substrate holding body 22 is performed.

The cleaning apparatus 25 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like).

The etching apparatus 26 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like).

The cleaning apparatus 25 and the etching apparatus 26 have the same configuration. The etching apparatus 26 will be described. The multiple number of substrates 8 constituting the single lot are held by the substrate elevating device 36 while being arranged in the forward-backward direction with the vertical posture. In the etching apparatus 26, the substrate elevating device 36 receives the lot from the substrate holding body 22 of the lot transfer device 19, and the received lot is moved up and down by the substrate elevating device 36. Accordingly, the lot is immersed in the processing liquid for etching in the processing tub 34, so that an etching processing is performed on the substrates 8. Thereafter, the etching apparatus 26 delivers the lot to the substrate holding body 22 of the lot transfer device 19 from the substrate elevating device 36. Then, the lot is received by the substrate elevating device 37 from the substrate holding body 22 of the lot transfer device 19, and the received lot is moved up and down by the substrate elevating device 37. Accordingly, the lot is immersed in the processing liquid for rinsing in the processing tub 35, so that a rinsing processing is performed on the substrates 8. Thereafter, the lot is delivered to the substrate holding body 22 of the lot transfer device 19 from the substrate elevating device 37.

The control unit 7 controls operations of individual components (the carrier carry-in/out unit 2, the lot forming unit 3, the lot placing unit 4, the lot transferring unit 5, the lot processing unit 6) of the substrate liquid processing system 1A.

The control unit 7 may be implemented by, for example, a computer and has a computer-readable recording medium 138. The recording medium 138 stores therein programs for controlling various types of processings performed in the substrate liquid processing system 1A. The control unit 7 controls the operation of the substrate liquid processing system 1A by reading and executing the programs stored in the recording medium 138. Further, the programs are stored in the compute-readable recording medium 138 and may be installed to the recording medium 138 of the control unit 7 from another recording medium. The computer-readable recording medium 138 may be implemented by, by way of example, a hard disk HD, a flexible disk FD, a compact disk CD, a magnet optical disk MO, a memory card, or the like.

<Substrate Liquid Processing Apparatus>

Figure 2:
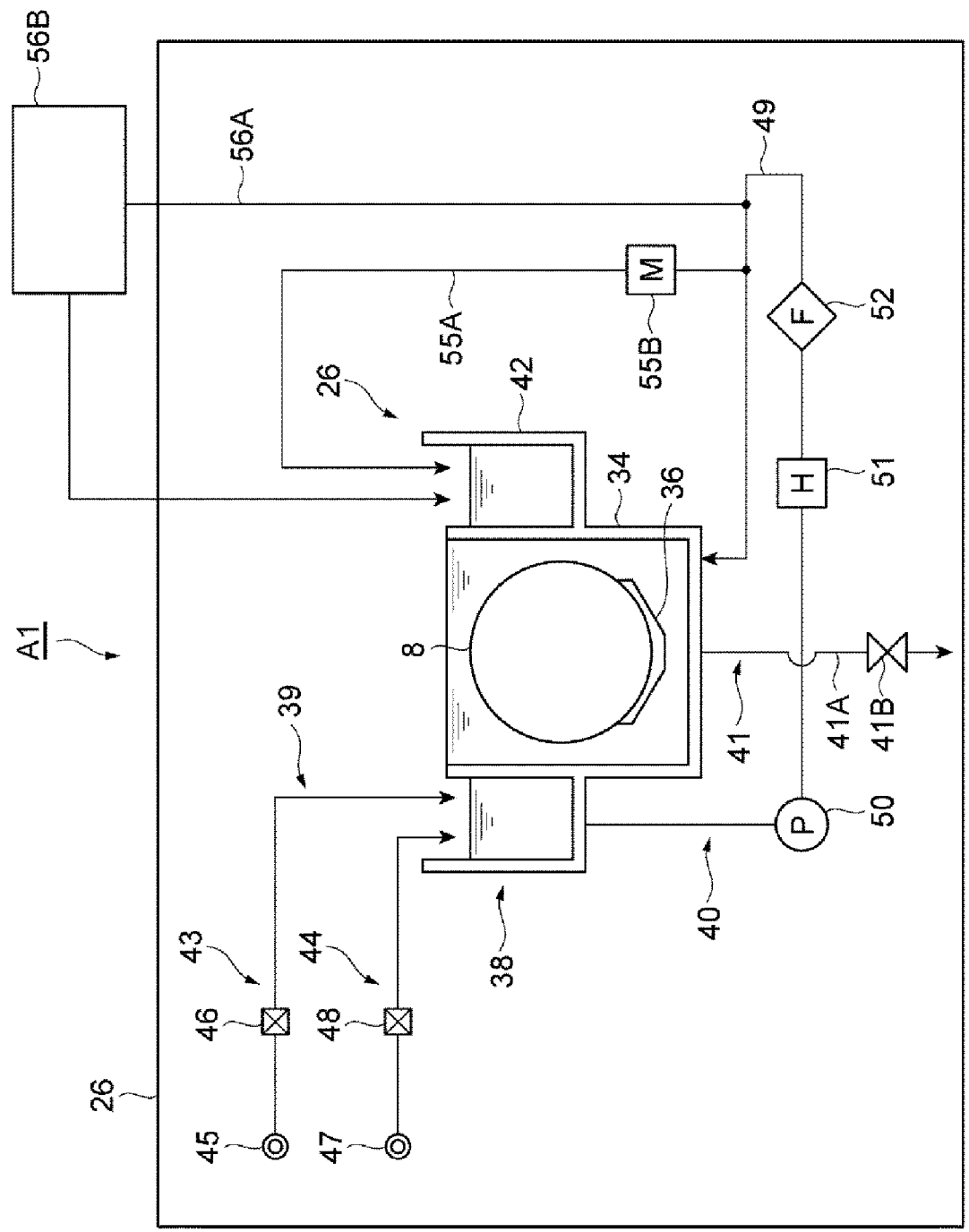
FIG. 2 is a schematic diagram of a substrate liquid processing apparatus.

Now, a substrate liquid processing apparatus A1 belonging to the substrate liquid processing system 1A will be described in detail. As illustrated in FIG. 2, the substrate liquid processing apparatus A1 includes an etching apparatus 26 and a silicon concentration measuring unit 56B.

(Etching Apparatus)

The etching apparatus 26 is configured to perform a liquid processing (etching processing) on the substrate 8 by using an aqueous solution of a chemical (phosphoric acid) having a preset concentration (for example, 88.3 6wt % of phosphoric acid aqueous solution) as a processing liquid for the etching. The etching apparatus 26 is equipped with, as shown in FIG. 2, a processing liquid storage unit 38, a processing liquid supply unit 39, a processing liquid circulation unit 40 and a processing liquid drain unit 41.

The processing liquid storage unit 38 stores the processing liquid, and the substrate 8 is processed therein. The processing liquid storage unit 38 includes a processing tub 34 having an open top; and an outer tub 42 which has an open top and is provided around an upper portion of the processing tub 34. The processing liquid is stored in the processing tub 34 and the outer tub 42. The processing tub 34 stores therein the processing liquid in which the substrate 8 is being immersed by the substrate elevating device 36 to be processed. The outer tub 42 stores therein the processing liquid overflowing from the processing tub 34. The processing liquid stored in the outer tub 42 is supplied into the processing tub 34 by the processing liquid circulation unit 40.

The processing liquid supply unit 39 is configured to supply the processing liquid into the processing liquid storage unit 38. The processing liquid supply unit 39 includes an aqueous solution supply unit 43 and a water supply unit 44. The aqueous solution supply unit 43 is configured to supply into the processing liquid storage unit 38 an aqueous solution of a chemical (phosphoric acid) having a concentration different from that of the processing liquid (that is, having a concentration lower than the concentration of the processing liquid). For example, the aqueous solution supply unit 43 supplies 85 wt % of phosphoric acid aqueous solution. The aqueous solution supply unit 43 includes an aqueous solution supply source 45 for supplying the phosphoric acid aqueous solution having a preset concentration (e.g., 85 wt %) and a preset temperature (e.g., 25° C.). The aqueous solution supply source 45 is connected to the outer tub 42 of the processing liquid storage unit 38 via a flow rate controller 46. The flow rate controller 46 is connected to the control unit 7, and an opening/closing operation and a flow rate of the flow rate controller 46 are controlled by the control unit 7. The water supply unit 44 is configured to supply water (pure water) into the processing liquid storage unit 38. The water supply unit 44 includes a water supply source 47 for supplying the pure water of a preset temperature (25° C.), and the water supply source 47 is connected to the outer tub 42 of the processing liquid storage unit 38 via a flow rate controller 48. The flow rate controller 48 is connected to the control unit 7, and an opening/closing operation and a flow rate of the flow rate controller 48 are controlled by the control unit 7.

The processing liquid circulation unit 40 is configured to send the processing liquid in the outer tub 42 into the processing tub 34. The processing liquid circulation unit 40 includes a circulation path 49, a pump 50, a heater 51 and a filter 52. The circulation path 49 is a flow path extended from a bottom portion of the outer tub 42 of the processing liquid storage unit 38 to a bottom portion of the processing tub 34. The circulation path 49 is equipped with the pump 50, the heater 51 and the filter 52 which are provided in sequence from an upstream side (outer tub 42 side) toward a downstream side (processing tub 34 side). The pump 50 and the heater 51 are connected to and driven by the control unit 7. The pump 50 is configured to force-feed the processing liquid from the upstream side toward the downstream side. The heater 51 is configured to heat the processing liquid to a set temperature (e.g., 165° C.). The filter 52 is configured to remove particles mixed in the processing liquid. Further, a branch path 55A branched from the circulation path 49 is connected to the outer tub 42, and the branch path 55A is provided with a phosphoric acid concentration meter 55B configured to measure a phosphoric acid concentration in the processing liquid.

The processing liquid drain unit 41 is configured to drain the processing liquid from the processing tub 34. The processing liquid drain unit 41 has, for example, a liquid drain path 41A and a valve 41B. The processing liquid within the processing tub 34 is drained through the liquid drain path 41A. One end of the liquid drain path 41A is connected to the bottom portion of the processing tub 34, and the other end of the liquid drain path 41A is connected to a liquid drain pipe (not shown) of the substrate liquid processing system 1A. The liquid drain path 41A is opened/closed by an opening/closing valve.

(Silicon Concentration Measuring Unit)

The silicon concentration measuring unit 56B is configured to measure the silicon concentration in the phosphoric acid aqueous solution used as the processing liquid and perform a processing based on the measurement result. As depicted in FIG. 2, the silicon concentration measuring unit 56B is provided at a branch path 56A branched from the circulation path 49 and connected to the outer tub 42. The silicon concentration measuring unit 56B weighs, in a preset amount, the processing liquid introduced from the circulation path 49 through the branch path 56A, and measures the silicon concentration after diluting the processing liquid additionally.

Figure 3:
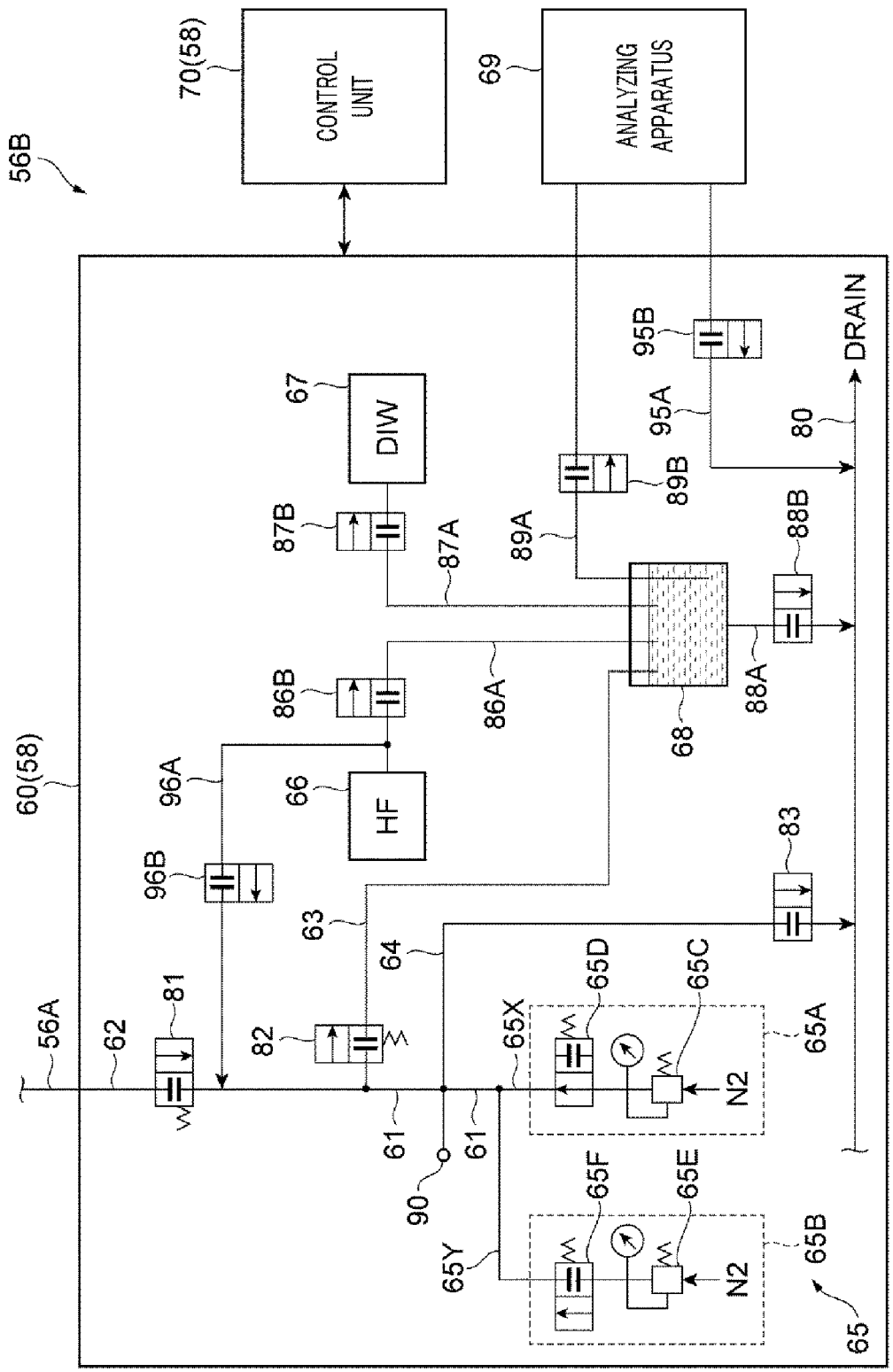
FIG. 3 is a schematic diagram of a silicon concentration measuring unit.

A schematic diagram of FIG. 3 provides a simple illustration of a pipeline configuration of the silicon concentration measuring unit 56B without considering a positional relationship between constitutional components (for example, vertical relationship of the layout, etc.). By way of example, as illustrated in FIG. 5A to FIG. 5D, a gas supply unit 65, a reception line 64, a discharge line 63 and an introduction line 62 are arranged in this sequence from the top. In the illustration of FIG. 3, however, this vertical relationship is not considered.

The silicon concentration measuring unit 56B includes, as depicted in FIG. 3, a weighing apparatus 58 and an analyzing apparatus 69. The weighing apparatus 58 includes a weighing device 60 and a control unit 70. Hereinafter, individual components of the weighing device 60 of the weighing apparatus 58, the analyzing apparatus 69 and the control unit 70 will be elaborated in sequence.

The weighing device 60 is equipped with a storage line 61, the introduction line 62, the discharge line 63, the reception line 64, the gas supply unit 65, a hydrogen fluoride supply unit 66, a water supply unit 67, a dilution tank 68, a first valve 81, a second valve 82, a third valve 83 and a proximity sensor 90.

The storage line 61 is a storage portion storing the processing liquid introduced from the branch path 56A through the introduction line 62. The storage line 61 is a pipeline which is extended in an up-and-down direction (vertical direction) and stores the processing liquid therein.

The introduction line 62 is an introduction portion through which the processing liquid is introduced into the storage line 61. One end of the introduction line 62 is connected to the branch path 56A, and the other end thereof is connected to the storage line 61. The introduction line 62 is provided with the first valve 81 configured to be opened/closed by the control unit 70. The first valve 81 adjusts a flow of the processing liquid in the introduction line 62. As the first valve 81 is turned into an open state, the processing liquid flown from the branch path 56A is introduced into the storage line 61. In this way, the introduction line 62 introduces into the storage line 61 the phosphoric acid aqueous solution which is the processing liquid as a target of the silicon concentration measurement. The introduction line 62 is connected to the storage line 61 under the reception line 64 and the discharge line 63, as shown in FIG. 5A to FIG. 5D.

The discharge line 63 is a discharge portion through which the processing liquid is discharged from the storage line 61. One end of the discharge line 63 is connected to the storage line 61, and the other end thereof is extended to the dilution tank 68. The discharge line 63 is provided with the second valve 82 configured to be opened/closed by the control unit 70. The second valve 82 adjusts a flow of the processing liquid in the discharge line 63. As the second valve 82 is turned into an open state, the processing liquid stored in the storage line 61 is guided into the dilution tank 68. That is, the discharge line 63 discharges the processing liquid within the storage line 61 into the dilution tank 68 (that is, a side of to the analyzing apparatus 69 to be described later). As shown in FIG. 5A to FIG. 5D, the discharge line 63 is connected to the storage line 61 under the reception line 64 and above the introduction line 62.

The reception line 64 is a pipeline branched and extended from the storage line 61. The reception line 64 receives the processing liquid exceeding a target storage amount (preset storage amount) in the storage line 61. The target storage amount may be set to be equal to or less than, e.g., 10 ml. As illustrated in FIG. 5A to FIG. 5D, in the storage line 61, the processing liquid stored in a portion of the storage line 61 ranging from a connection point to the discharge line 63 to a branch point of the branch line 64 is the processing liquid of the target storage amount, and is discharged into the dilution tank 68 through the discharge line 63. Accordingly, the position of the reception line 64 (the branch point from the storage line 61) is determined based on the target storage amount (the amount of the processing liquid discharged into the dilution tank 68 through the discharge line 63) in the storage line 61. As depicted in FIG. 5A to FIG. 5D, for example, the reception line 64 is extended in a direction orthogonal to the storage line 61 extended in the up-and-down direction so that the reception line 64 and the storage line 61 form a T-shape together. An end of the reception line 64 opposite to an end thereof branched from the storage line 61 is connected to a liquid drain line 80. The reception line 64 is provided with the third valve 83 configured to be opened/closed by the control unit 70. The third valve 83 adjusts a flow of the processing liquid within the reception line 64. As the third valve 83 is turned into an open state, the processing liquid flown from the storage line 61 (the processing liquid exceeding the target storage amount) is guided into the liquid drain line 80. The reception line 64 receives the processing liquid which is strickled as a nitrogen gas is jetted to the surface of the processing liquid by the gas supply unit 65 (details thereof will be described later).

The proximity sensor 90 is provided at the storage line 61 and is configured to detect that the processing liquid has reached the target storage amount. The proximity sensor 90 can be any of various types as long as it is capable of detecting existence of the processing liquid. By way of non-limiting example, the proximity sensor 90 may be a capacitive sensor. As stated above, since the storage amount of the processing liquid stored in the portion of the storage line 61 ranging from the connection point to the discharge line 63 to the branch point of the reception line 64 corresponds to the target storage amount, the proximity sensor 90 is provided at the storage line 61 to be positioned at the branch point of the storage line 64, and detects whether the processing liquid is stored up to the corresponding branch point. The proximity sensor 90 sends a detection result to the control unit 70.

The gas supply unit 65 is configured to jet the nitrogen gas onto the surface (top surface) of the processing liquid stored in the storage line 61. To be more specific, the gas supply unit 65 supplies the nitrogen gas to a portion of the storage line 61 above the reception line 64, as shown in FIG. 5A to FIG. 5D. The gas supply unit 65 is equipped with a first supply unit 65A and a second supply unit 65B.

The first supply unit 65A is configured to perform a strickling (excess target storage amount removal) of the processing liquid by jetting a gas to the surface of the processing liquid stored in the storage line 61. Here, the term "strickling of the processing liquid" means allowing the processing liquid exceeding the target storage amount of the storage line 61 to be flown to the liquid drain line 80 through the reception line 64. To be more specific, the "strickling of the processing liquid" means allowing a processing liquid PL (see FIG. 5A) stored in a portion of the storage line 61 above a lower end 61X of the portion of the storage line 61 to which the reception line 64 is connected and a processing liquid P2 (see FIG. 5A) existing in the reception line 64 to be flown to the liquid drain line 80 through the reception line 64. The first supply unit 65A is provided at a branch line 65X connected to an upper end of the storage line 61 and equipped with a nitrogen gas supply source 65C and a valve 65D. As the valve 65D is opened and the nitrogen gas supply source 65C is controlled to supply (press) the nitrogen gas by the control unit 70, the first supply unit 65A supplies the nitrogen gas to the storage line 61 through the branch line 65X and jets the nitrogen gas to the surface of the processing liquid.

The second supply unit 65B presses the processing liquid toward the discharge line 63 by jetting a gas to the surface of the processing liquid stored in the storage line 61. The injection of the gas to the surface of the processing liquid by the second supply unit 65B is performed after the above-stated strickling of the processing liquid by the first supply unit 65A is performed (details of this injection operation will be discussed later). The second supply unit 65B is provided at a branch line 65Y connected to the upper end of the storage line 61 and equipped with a nitrogen gas supply source 65E and a valve 65F. In the second supply unit 65B, the valve 65F is opened and the nitrogen gas supply source 65E is controlled to supply (press) the nitrogen gas by the control unit 70, so that the nitrogen gas is supplied to the storage line 61 through the branch line 65Y and jetted to the surface of the processing liquid. By way of example, a flow rate of the nitrogen gas jetted from the second supply unit 65B is approximately the same as a flow rate of the nitrogen gas jetted from the first supply unit 65A.

The hydrogen fluoride supply unit 66 is configured to supply hydrogen fluoride to the dilution tank 68 through a pipeline 86A. As a valve 86B provided at the pipeline 86A is opened by the control unit 70, the hydrogen fluoride supply unit 66 supplies the hydrogen fluoride into the dilution tank 68 through the pipeline 86A. Further, the hydrogen fluoride supply unit 66 supplies the hydrogen fluoride to the storage line 61 through a pipeline 96A in a cleaning processing of the storage line 61 or the like (details of this cleaning processing will be explained later). As a valve 96B provided at the pipeline 96A is opened by the control unit 70, the hydrogen fluoride supply unit 66 supplies the hydrogen fluoride into the storage line 61 through the pipeline 96A.

The water supply unit 67 is configured to supply water (pure water) to the dilution tank 68 via a pipeline 87A. As a valve 87B provided at the pipeline 87A is opened by the control unit 70, the water supply unit 67 supplies the water to the dilution tank 68 through the pipeline 87A.

The dilution tank 68 is a tank for diluting the phosphoric acid aqueous solution, as the processing liquid, supplied through the discharge line 63. As stated above, the phosphoric acid aqueous solution as the processing liquid, the hydrogen fluoride and the water are supplied into the dilution tank 68. In the dilution tank 68, the processing liquid is sufficiently diluted such that the silicon concentration can be measured and analyzed in the analyzing apparatus 69. A dilution ratio may be equal to or higher than, e.g., 100 times. The diluted solution after being diluted is then supplied to the analyzing apparatus 69 through a pipeline 89A. A pipeline 88A connected to the liquid drain line 80 is coupled to a bottom portion of the dilution tank 68. The pipeline 88A is provided with a valve 88B. As the valve 88B is opened by the control unit 70, the diluted solution in the dilution tank 68 is drained through the pipeline 88A.

The analyzing apparatus 69 is a concentration measuring unit configured to measure a concentration of the processing liquid by analyzing the diluted solution supplied through the pipeline 89A. As a valve 89B provided at the pipeline 89A is opened by the control unit 70, the analyzing apparatus 69 receives the diluted solution through the pipeline 89A. The analyzing apparatus 69 outputs the concentration of the processing liquid to the control unit 70 as a measurement result. A pipeline 95A connected to the liquid drain line 80 is coupled to a bottom portion of the analyzing apparatus 69. The pipeline 95A is provided with a valve 95B. As the valve 95B is opened by the control unit 70, the diluted solution after being subjected to the concentration measurement is drained through the pipeline 95A.

The control unit 70 is configured to perform a storage control of allowing the processing liquid introduced from the introduction line 62 to be stored in the storage line 61 by opening the first valve 81 and the third valve 83 while closing the second valve 82; and a strickling control of closing, after the storage control, the first valve 81 and controlling the gas supply unit 65 such that the processing liquid is strickled by jetting the nitrogen gas into the storage line 61.

Further, the control unit 70 may be further configured to perform, after the aforementioned strickling control, a liquid feed control of closing the third valve 83 while opening the second valve 82, and controlling the gas supply unit 65 such that the processing liquid within the storage line 61 is pressed toward the discharge line 63 by jetting the nitrogen gas into the storage line 61.

Further, the control unit 70 may end the aforementioned storage control when it is detected by the proximity sensor 90 that the processing liquid has reached the target storage amount.

Furthermore, if it is not detected by the proximity sensor 90 that the processing liquid has reached the target storage amount after a lapse of a preset storage time, the control unit 70 may make a determination that an abnormal state has occurred.

In addition, the control unit 70 may be configured to determine whether the concentration of the processing liquid measured by the analyzing apparatus 69 is of a preset normal value and set forth an alert when the measured concentration is not the preset normal value.

The control unit 70 may be implemented by, for example, a computer and has a computer-readable recording medium (not shown). The recording medium stores therein programs for controlling various kinds of processings performed in the silicon concentration measuring unit 56B. The control unit 7 controls the operation of the silicon concentration measuring unit 56B by reading and executing the programs stored in the recording medium. Further, the programs are stored in the compute-readable recording medium, and may be installed to the recording medium of the control unit 70 from another recording medium. The computer-readable recording medium may be implemented by, by way of example, a hard disk HD, a flexible disk FD, a compact disk CD, a magnet optical disk MO, a memory card, or the like.

Figure 4:
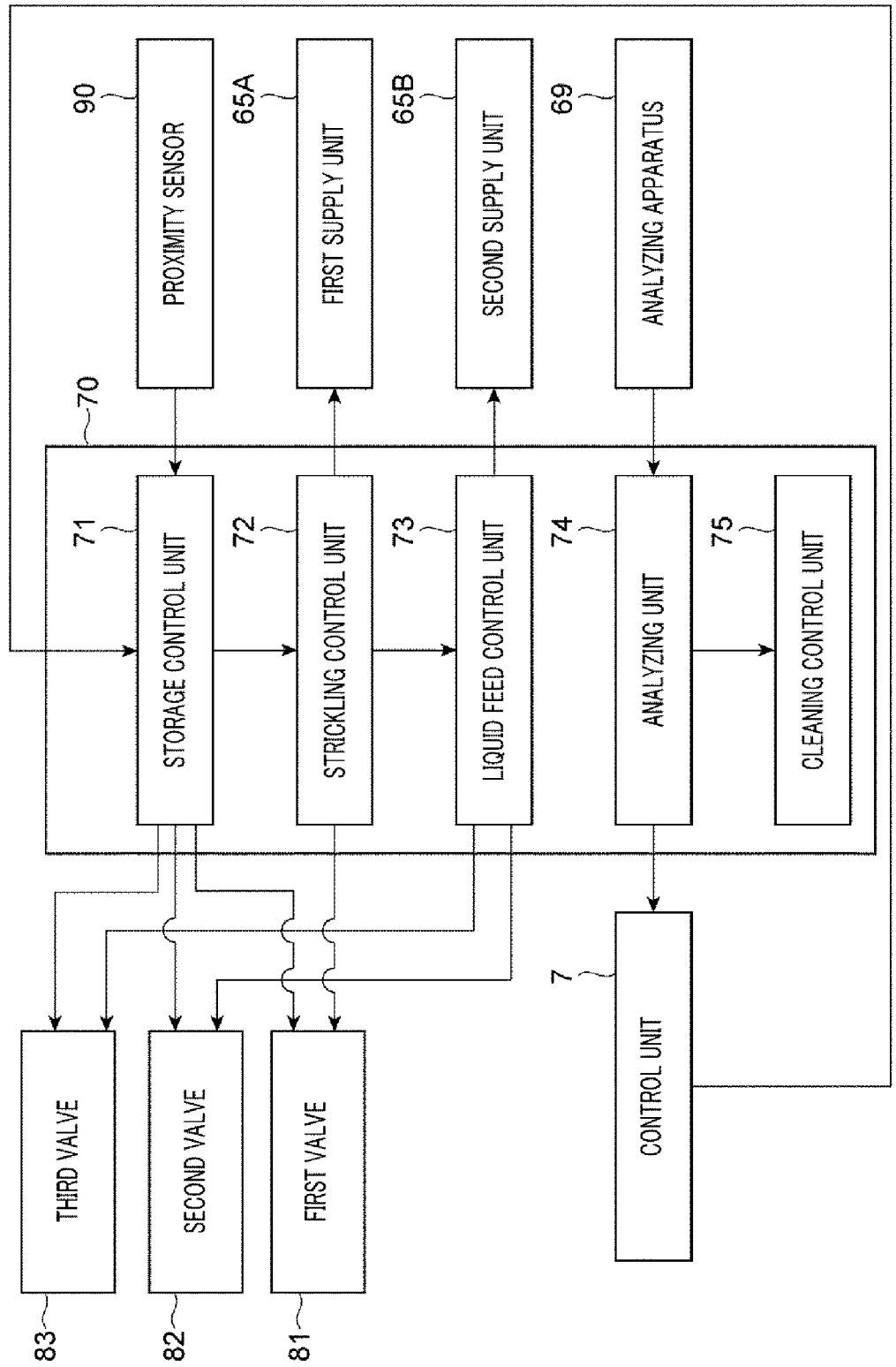
FIG. 4 is a block diagram illustrating a functional configuration of a control unit.

FIG. 4 is a block diagram illustrating a functional configuration of the control unit 70. As depicted in FIG. 4, the control unit 70 includes, as functional components (functional modules), a storage control unit 71, a strickling control unit 72, a liquid feed control unit 73, an analyzing unit 74 and a cleaning control unit 75.

Figure 5:
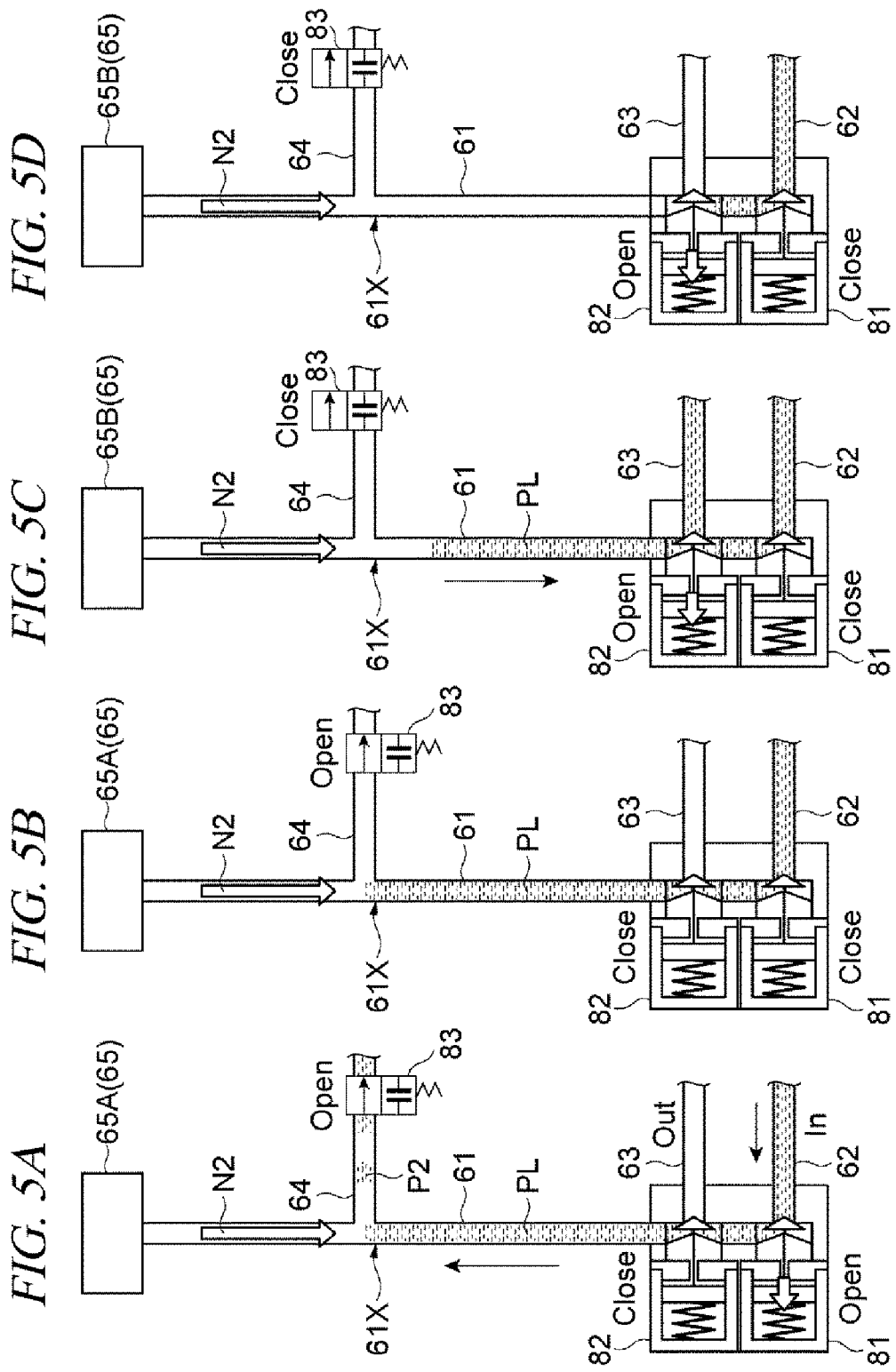
FIG. 5A to FIG. 5D are schematic diagrams illustrating the silicon concentration measuring unit in a weighing processing.

The storage control unit 71 is configured to perform the storage control of allowing the processing liquid introduced from the introduction line 62 to be stored in the storage line 61. The storage control unit 71 starts the storage control in response to, for example, a processing start (concentration measurement start of the processing liquid by the silicon concentration measuring unit 56B) signal from the control unit 7. The storage control unit 71 opens the first valve 81 and the third valve 83, and closes the second valve 82. That is, the storage control unit 71 enables introduction of the processing liquid into the storage line 61 from the introduction line 62 and reception of the processing liquid into the reception line 64 from the storage line 61. In this case, the processing liquid introduced from the introduction line 62 is stored in the storage line 61, and, with a lapse of sufficient time, the processing liquid PL is stored up to the portion of the storage line 61 above the lower end 61X of the portion thereof to which the reception line 64 is connected, as shown in FIG. 5A. Further, a part of the processing liquid PL is flown into the reception line 64. Accordingly, the proximity sensor 90 detects that the processing liquid is stored. If it is detected by the proximity sensor 90 that the processing liquid has reached the target storage amount, the storage control unit 71 ends the storage control.

If it is not detected by the proximity sensor 90 that the processing liquid has reached the target storage amount even after the preset storage time has elapsed, the storage control unit 71 determines that an abnormal state has arisen. The preset storage time is set, based on the flow rate of the processing liquid introduced into the storage line 61 from the introduction line 62, to be a time at which the target storage amount is assumed to be achieved.

Further, during the storage control, the supply of the nitrogen gas by the first supply unit 65A may be continuously performed as shown in FIG. 5A, or the supply of the nitrogen gas may not be performed. In case that the supply of the nitrogen gas is not performed during the storage control, the supply of the nitrogen gas by the first supply unit 65A is begun at a time when it is detected by the proximity sensor 90 that the processing liquid has reached the target storage amount.

The strickling control unit 72 is configured to perform, after the storage control by the storage control unit 71, the strickling control of weighing the processing liquid as much as the target storage amount. After the storage control, the strickling control unit 72 closes the first valve 81, and controls the first supply unit 65A such that the processing liquid is strickled by supplying the nitrogen gas to the storage line 61. To elaborate, the strickling control unit 72 opens the valve 65D of the first supply unit 65A and controls the nitrogen gas supply source 65C to supply the nitrogen gas. Further, in case that the supply of the nitrogen gas by the first supply unit 65A is being continuously performed starting from the storage control, the strickling control unit 72 controls the first supply unit 65A to continue the supply of the nitrogen gas during the strickling control as well. In this case, the processing liquid PL (see FIG. 5A) stored above the lower end 61X is strickled to be introduced into the reception line 64, and the processing liquid P2 (see FIG. 5A) existing in the reception line 64 is sent into the liquid drain line 80 through the reception line 64. Accordingly, as depicted in FIG. 5B, only the processing liquid PL stored in the portion of the storage line 61 ranging from the connection point to the discharge line 63 to the branch point of the reception line 64 is left, so that the processing liquid is weighed as much as the storage target amount. Further, as illustrated in FIG. 5B, after the target storage amount is obtained, the processing liquid is still left in the introduction line 62 and a portion of the storage line 61 above the introduction line 62 and under the discharge line 63. Since, however, this processing liquid is not flown into the discharge line 63 in the liquid feed control to be described later, it does not cause any problem in discharging the processing liquid of the target storage amount.

The liquid feed control unit 73 is configured to perform the liquid feed control of allowing, after the strickling control by the strickling control unit 72, the processing liquid within the storage line 61 to be pressed toward the discharge line 63. After the strickling control, the liquid feed control unit 73 closes the third valve 83 and opens the second valve 82, and controls the second supply unit 65B such that the processing liquid in the storage line 61 is pressed toward the discharge line 63 by jetting the nitrogen gas to the storage line 61. To elaborate, the liquid feed control unit 73 closes the valve 65D of the first supply unit 65A and opens the valve 65F of the second supply unit 65B, and controls the nitrogen gas supply source 65E to supply the nitrogen gas. Accordingly, the supply of the nitrogen gas, which is performed by the first supply unit 65A in the strickling control, is now performed by the second supply unit 65B in the liquid feed control. As shown in FIG. 5C, the processing liquid PL pressed by the nitrogen gas from the second supply unit 65B is pressed toward the discharge line 63 to be discharged into the dilution tank 68 through the discharge line 63. Accordingly, as shown in FIG. 5D, the processing liquid PL (weighed processing liquid of the target storage amount) stored in the portion of the storage line 61 ranging from the connection point to the discharge line 63 to the branch point of the reception line 64 is discharged into the dilution tank 68.

The liquid feed control unit 73 is further configured to perform, along with the aforementioned liquid feed control, a control of supplying the hydrogen fluoride and the water into the dilution tank 68. That is, the liquid feed control unit 73 controls the hydrogen fluoride and the water to be supplied into the dilution tank 68 by opening the valve 86B of the pipeline 86A and the valve 87B of the pipeline 87A.

Furthermore, the liquid feed control unit 73 also controls an agitator (not shown) provided in, for example, the dilution tank 68 to agitate the phosphoric acid aqueous solution as the processing liquid, the hydrogen fluoride and the water stored in the dilution tank 68. The agitation of the processing liquid and the others is performed for a preset time (for example, 30 sec). A sensor (e.g., a proximity sensor) configured to detect existence of the processing liquid is provided at an upper portion of the dilution tank 68, and the agitation may be controlled to be performed under a condition where the processing liquid is not detected by the sensor (that is, under a condition where the processing liquid and the others do not flow over from the dilution tank 68). The liquid feed control unit 73 controls, after the agitation (dilution) of the processing liquid and the others, the diluted solution to be supplied to the analyzing apparatus 69 by opening the valve 89B of the pipeline 89A.

The analyzing unit 74 is configured to perform a control according to a measurement result of the analyzing apparatus 69. The analyzing unit 74 acquires the measurement result (silicon concentration of the processing liquid) from the analyzing apparatus 69. The analyzing unit 74 then determines whether the obtained silicon concentration is the preset normal value or not. If the silicon concentration is the normal value, the analyzing unit 74 notifies the control unit 7 of this silicon concentration. If the silicon concentration is not the normal value, on the other hand, the analyzing unit 74 notifies the control unit 7 of an alert (information indicating abnormality) as well as this silicon concentration. By opening the valve 95B of the pipeline 95A, the analyzing unit 74 is controlled to drain the diluted solution in the analyzing apparatus 69 after being subjected to the concentration measurement. Further, the analyzing unit 74 is controlled to drain the diluted solution left in the dilution tank 68, by opening the valve 88B of the pipeline 88A.

The cleaning control unit 75 controls, after the above-stated processing by the analyzing unit 74, such that the dilution tank 68, the storage line 61, the discharge line 63, the reception line 64 and the like are cleaned by the hydrogen fluoride. This cleaning is performed for the purposes of suppressing contamination of the dilution tank 68, the storage line 61 and the like by suppressing the processing liquid from being left in the dilution tank 68, the storage line 61, and the like. This cleaning processing may be performed whenever the weighing is performed (that is, whenever the liquid feed into the dilution tank 68 is performed), or whenever the weighing is performed a preset number of times.

After the control by the analyzing unit 74, the cleaning control unit 75 supplies the hydrogen fluoride to the storage line 61 by opening the valve 96B of the pipeline 96A in the state that the first valve 81 and the second valve 82 are closed and the third valve 83 is opened. The cleaning control unit 75 controls the first supply unit 65A to supply the nitrogen gas into the storage line 61. To elaborate, the cleaning control unit 75 opens the valve 65D of the first supply unit 65A, and controls the nitrogen gas supply source 65C to supply the nitrogen gas. As the nitrogen gas is supplied, strickled hydrogen fluoride is flown into the reception line 64 from the storage line 61 and is drained into the liquid drain line 80. Accordingly, the storage line 61 and the reception line 64 can be cleaned by the hydrogen fluoride. In this state, the hydrogen fluoride of a preset amount (the aforementioned target storage amount) exists within the storage line 61. While the hydrogen fluoride of the preset amount remains within the storage line 61, the cleaning control unit 75 may close the valve 96B of the pipeline 96A (that is, stops the introduction of the hydrogen fluoride into the storage line 61) and stand by for a predetermine time (an enough time for cleaning the storage line 61). Further, as a cleaning liquid stored in the storage line 61, water may be contained in addition to the hydrogen fluoride.

The cleaning control unit 75 presses the hydrogen fluoride within the storage line 61 toward the discharge line 63. The cleaning control unit 75 controls the second supply unit 65B to allow the hydrogen fluoride within the storage line 61 to be pressed toward the discharge line 63 by jetting the nitrogen gas into the storage line 61 while opening the second valve 82 and closing the third valve 83. To elaborate, the cleaning control unit 75 controls the nitrogen gas supply source 65E to supply the nitrogen gas by closing the valve 65D of the first supply unit 65A and opening the vale 65F of the second supply unit 65B. As the nitrogen gas is supplied, the hydrogen fluoride within the storage line 61 is flown toward the discharge line 63 to be discharged into the dilution tank 68 through the discharge line 63. Accordingly, the discharge line 63 and the dilution tank 68 can be cleaned by the hydrogen fluoride. Further, the cleaning control unit 75 opens the valve 86B of the pipeline 86A to allow the hydrogen fluoride to be supplied into the dilution tank 68 through the pipeline 86A, and opens the valve 87B of the pipeline 87A to allow the water to be supplied into the dilution tank 68 through the pipeline 87A. Accordingly, the hydrogen fluoride and the water are supplied into the dilution tank 68. As a result, the hydrogen fluoride within the dilution tank 68 is diluted, so that the cleaning liquid (diluted hydrogen fluoride) is ready to be sent to the analyzing apparatus 69 which is incapable of receiving hydrogen fluoride which is not diluted.

The cleaning control unit 75 stores the hydrogen fluoride at least up to a region of the dilution tank 68 where the processing liquid (phosphoric acid aqueous solution) is stored. The cleaning control unit 75 may determine whether the hydrogen fluoride within the dilution tank 68 has reached a preset amount by using the sensor (for example, the proximity sensor) provided at the upper portion of the dilution tank 68. Furthermore, in case that it is already known that the hydrogen fluoride has reached the preset amount by performing the above-described feed of the hydrogen fluoride through the discharge line 63 a preset number of times (for example, twice), the cleaning control unit 75 may determine whether the hydrogen fluoride within the dilution tank 68 has reached the preset amount by determining whether the hydrogen fluoride is fed the preset number of times.

The cleaning control unit 75 presses the hydrogen fluoride within the dilution tank 68 (the hydrogen fluoride diluted with the water, hereinafter, referred to as "diluted hydrogen fluoride") toward the analyzing apparatus 69. The cleaning control unit 75 sends the diluted hydrogen fluoride within the dilution tank 68 toward the analyzing apparatus 69 through the pipeline 89A by opening the valve 89B of the pipeline 89A. Accordingly, the pipeline 89A and the analyzing apparatus 69 can be cleaned by the diluted hydrogen fluoride.

After a sufficient amount of the diluted hydrogen fluoride is sent to the analyzing apparatus 69, the cleaning control unit 75 opens the valve 88B of the pipeline 88A to allow the diluted hydrogen fluoride left in the dilution tank 68 to be drained, and opens the valve 95B of the pipeline 95A to allow the diluted hydrogen fluoride in the analyzing apparatus 69 to be drained.

<Substrate Liquid Processing Method>

Figure 6:
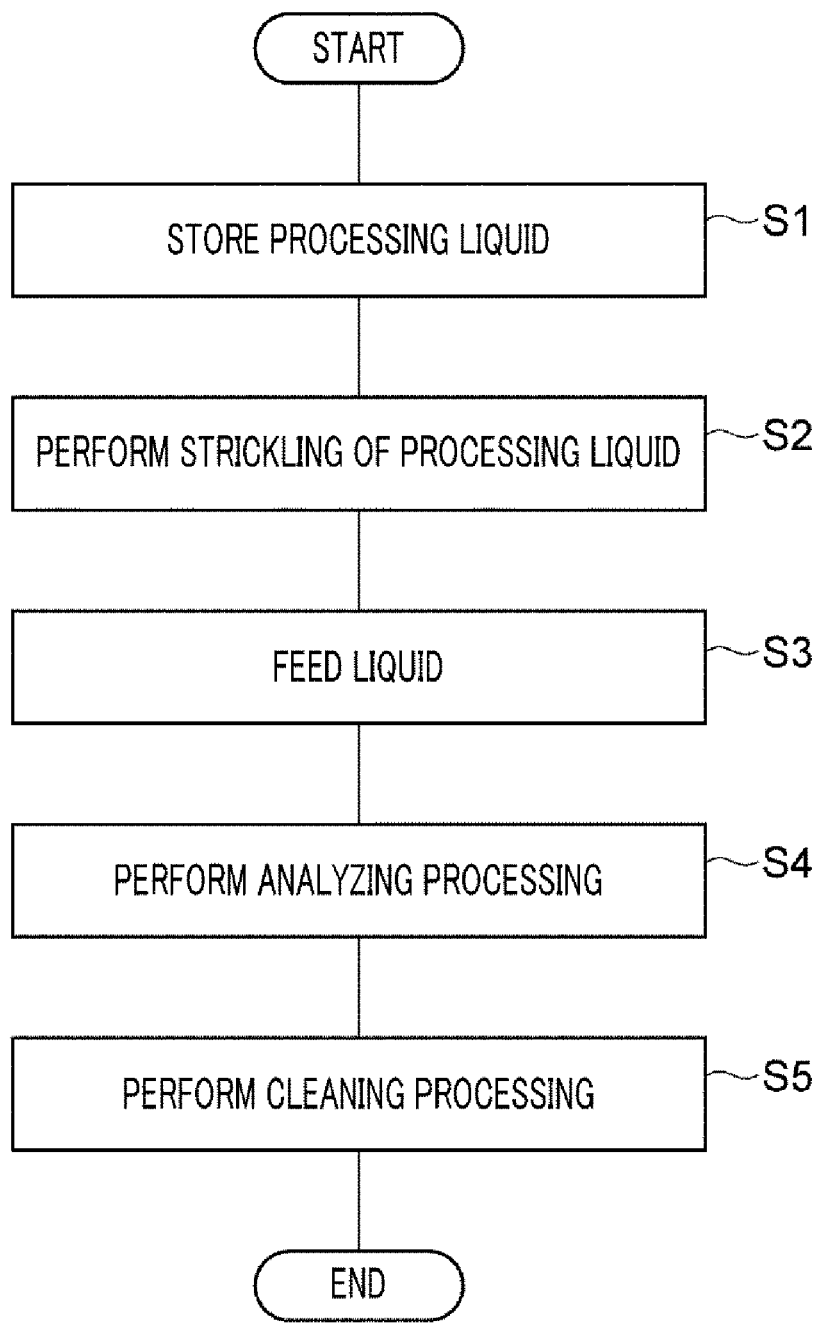
FIG. 6 is a flowchart for describing a sequence of a concentration measuring processing.

Now, as an example of a substrate liquid processing method, a sequence of a concentration measurement processing performed by the control unit 70 will be explained. As shown in FIG. 6, the control unit 70 first performs a process S1. The process S1 includes a storage processing of performing the aforementioned storage control over the processing liquid. A more detailed sequence thereof will be elaborated later. Then, the control unit 70 performs a process S2. The process S2 includes a strickling processing of performing the aforementioned strickling control over the processing liquid. A more detailed sequence thereof will be described later. Thereafter, the control unit 70 performs a process S3. The process S3 includes a liquid feed processing of performing the aforementioned liquid feed control. A more detailed sequence thereof will be discussed later. Subsequently, the control unit 70 performs a process S4. The process S4 includes a concentration analyzing processing of performing the aforementioned silicon concentration analyzing processing. A more detailed sequence thereof will be explained later. Next, the control unit 70 performs a process S5. The process S5 includes a cleaning processing of performing the aforementioned cleaning control. Thereafter, while the silicon concentration measuring unit 65B is being driven, the storage processing, the strickling processing, the liquid feed processing, the concentration analyzing processing and the cleaning processing are performed repeatedly. Further, the cleaning processing of the process S5 may be performed one time whenever the processes S1 to S4 are performed a predetermined number of times.

(Sequence of Storage Processing)

Figure 7:
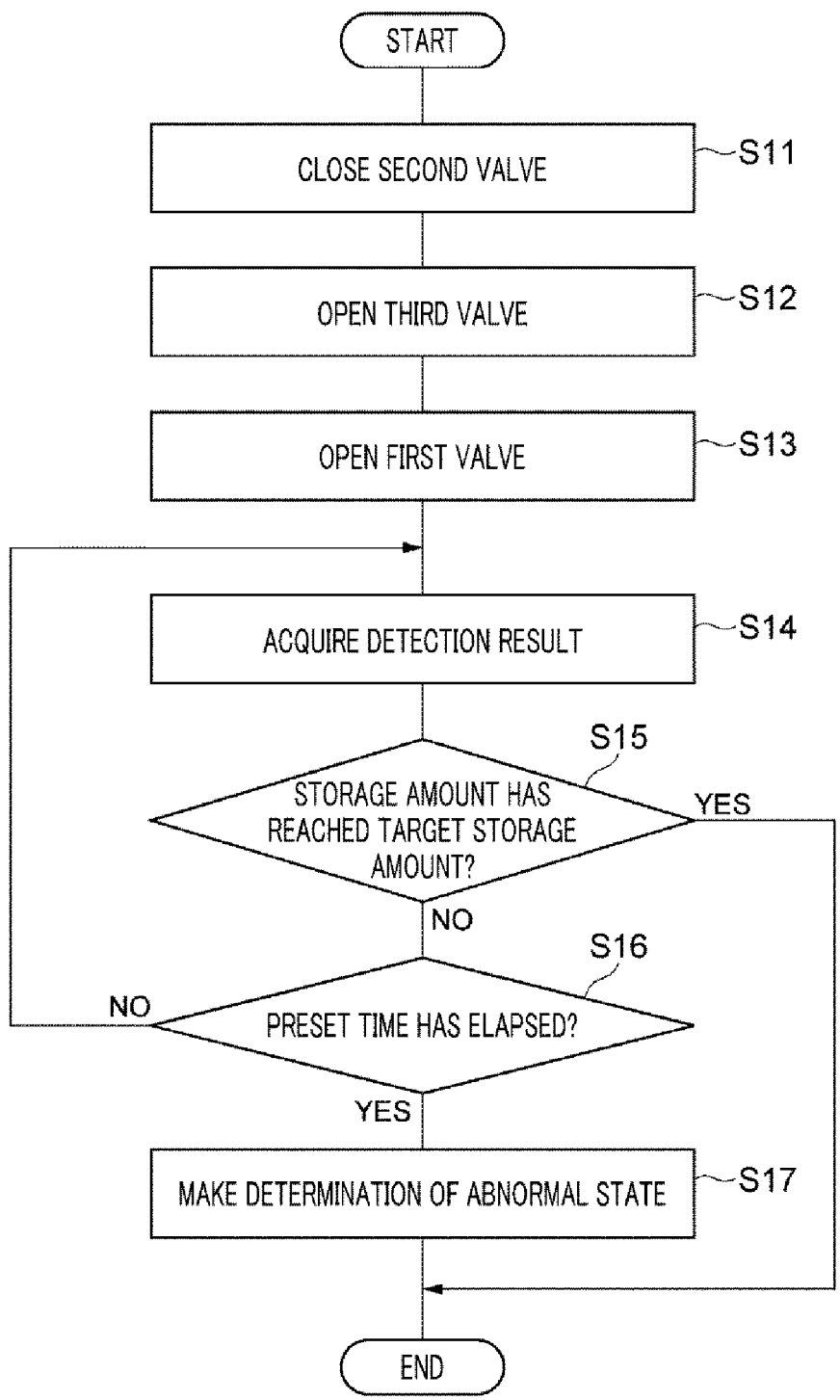
FIG. 7 is a flowchart for describing a sequence of the storage processing.

Subsequently, the detailed sequence of the storage processing of performing the storage control of the processing liquid in the process S1 will be explained. As shown in FIG. 7, the control unit 70 first performs a process S11. In the process S11, the storage control unit 71 closes the second valve 82. Accordingly, the processing liquid can be suppressed from being discharged from the discharge line 63 while the processing liquid is being stored in the storage line 61.

Then, the control unit 70 performs a process S12. In the process S12, the storage control unit 71 opens the third valve 83. Accordingly, there is created a state in which the processing liquid can be flown into the reception line 64 from the storage line 61.

Next, the control unit 70 performs a process S13. In the process S13, the storage control unit 71 opens the first valve 81. Accordingly, the processing liquid is begun to be introduced into the storage line 61 from the introduction line 62 (see FIG. 5A).

Thereafter, the control unit 70 performs a process S14. In the process S14, the storage control unit 71 acquires a detection result of the processing liquid from the proximity sensor 90. For example, the control unit 70 acquires the detection result from the proximity sensor 90 at a preset time interval.

Then, the control unit 70 performs a process S15. In the process S15, the storage control unit 71 determines whether a storage amount of the processing liquid has reached the target storage amount based on the detection result from the proximity sensor 90. If it is found out in the process S15 that the storage amount has reached the target storage amount, the storage processing (the process S1) of performing the storage control is ended.

Meanwhile, if it is found out in the process S15 that the storage amount has not reached the target storage amount (that is, if the proximity sensor 90 does not detect the processing liquid), the control unit 70 performs a process S16. In the process S16, the storage control unit 71 determines whether the preset storage time has passed by. The preset storage time is set, based on the flow rate of the processing liquid introduced into the storage line 61 from the introduction line 62, to be a time at which the target storage amount is assumed to be achieved. If it is found out in the process S16 that the preset storage time has not elapsed, the control unit 70 performs the process S14 again.

If it is determined in the process S16 that the preset storage time has passed by, the control unit 70 performs a process S17. In the process S17, the storage control unit 71 determines that an abnormal state has occurred, and the storage processing (process S1) is ended. If the processing liquid has not reached the target storage amount even after the preset storage time has elapsed, it may be assumed that there has occurred a problem in the configuration for storing the processing liquid. By performing this determination of the abnormality as described above, it is possible to determine the problem in the configuration for storing the processing liquid simply with high accuracy. Further, even if the abnormal state is determined, the control unit 70 may continue the processings from the process S14.

(Sequence of Strickling Processing)

Figure 8:
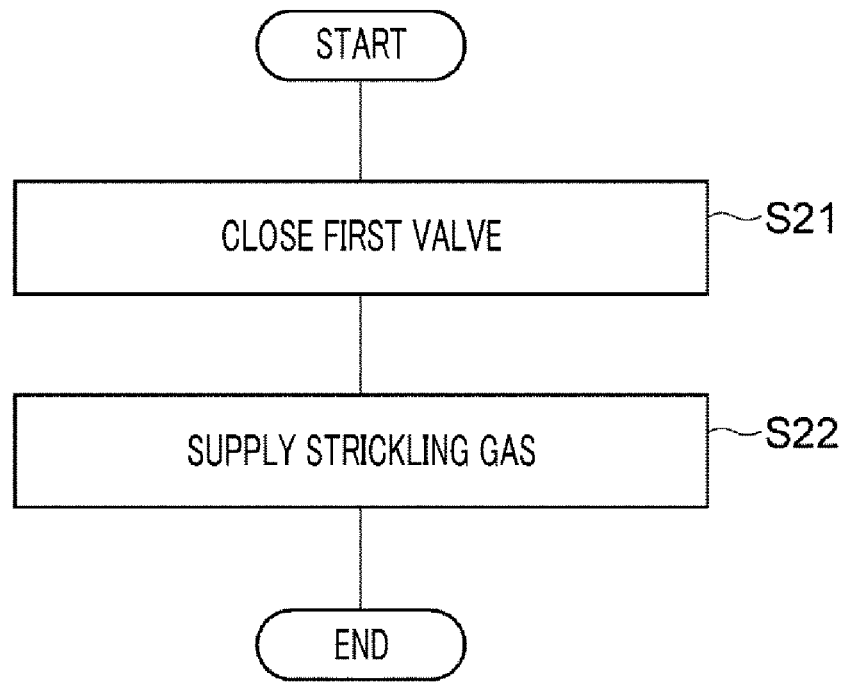
FIG. 8 is a flowchart for describing a sequence of the strickling processing.

Now, the detailed sequence of the strickling processing of performing the strickling control of the processing liquid in the aforementioned process S2 will be explained. As depicted in FIG. 8, the control unit 70 first performs a process S21. In the process S21, the strickling control unit 72 closes the first valve 81. Accordingly, the introduction of the processing liquid from the introduction line 62 into the storage line 61 is stopped.

Then, the control unit 70 performs a process S22. In the process S22, the strickling control unit 72 controls the first supply unit 65A to supply the nitrogen gas into the storage line 61 to allow strickling of the processing liquid to be performed. That is, the strickling control unit 72 controls the first supply unit 65A to supply a gas for strickling (strickling gas). To elaborate, the valve 65D of the first supply unit 65A is opened, and the nitrogen gas supply source 65C is controlled to supply the nitrogen gas. In this case, the processing liquid PL (see FIG. 5A) stored above the lower end 61X is strickled and introduced into the reception line 64, and the processing liquid P2 (see FIG. 5A) existing in the reception line 64 is introduced into the liquid drain line 80 through the reception line 64. Accordingly, as depicted in FIG. 5B, only the processing liquid PL stored in the portion of the storage line 61 ranging from the connection point to the discharge line 63 to the branch point of the reception line 64 remains, so that the target storage amount is weighed. Then, the strickling processing (process S2) of performing the strickling control of the processing liquid is completed.

(Sequence of Liquid Feed Processing)

Figure 9:
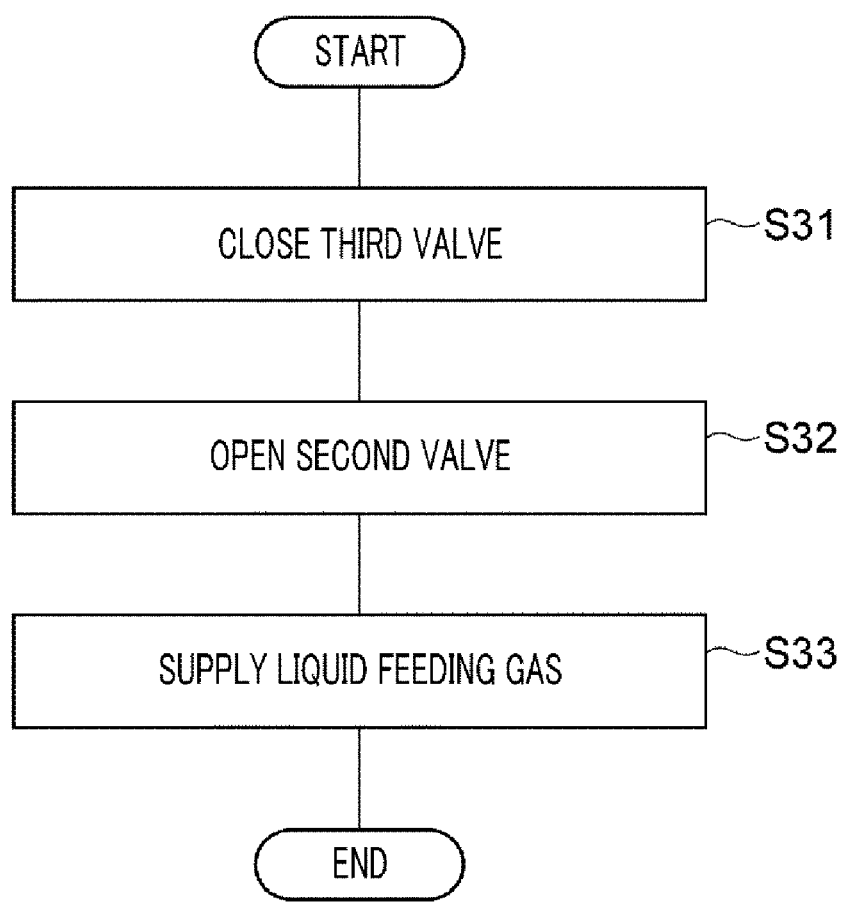
FIG. 9 is a flowchart for describing a sequence of the liquid feeding processing.

Now, the detailed sequence of the liquid feed processing of performing the liquid feed control in the process S3 will be elaborated. As depicted in FIG. 9, the control unit 70 first performs a process S31. In the process S31, the liquid feed control unit 73 closes the third valve 83. Accordingly, the nitrogen gas can be suppressed from flowing to the reception line 64 after the strickling control.

Next, the control unit 70 performs a process S32. In the process S32, the liquid feed control unit 73 opens the second valve 82. Accordingly, the processing liquid after being weighed can be discharged to the dilution tank 68 through the discharge line 63.

Thereafter, the control unit 70 performs a process S33. In the process S33, the liquid feed control unit 73 controls the second supply unit 65B to supply the nitrogen gas to the storage line 61 to press the processing liquid within the storage line 61 toward the discharge line 63. That is, the liquid feed control unit 73 controls the second supply unit 65B to supply a gas (liquid feeding gas) for the liquid feed. To be more specific, the valve 65D of the first supply unit 65A is closed and the valve 65F of the second supply unit 65B is opened, and the nitrogen gas supply source 65E is controlled to supply the nitrogen gas. In this case, as shown in FIG. 5C, the processing liquid PL pressed by the nitrogen gas from the second supply unit 65B is pressed toward the discharge line 63 to be discharged into the dilution tank 68 through the discharge line 63. As a result, as depicted in FIG. 5D, the processing liquid PL (weighed processing liquid of the target storage amount) stored in the region ranging from the connection point to the discharge line 63 and the branch point of the reception line 64 is discharged to the dilution tank 68. Then, the liquid feed processing (process S3) of performing the liquid feed control is finished.

(Sequence of Concentration Analyzing Processing)

Figure 10:
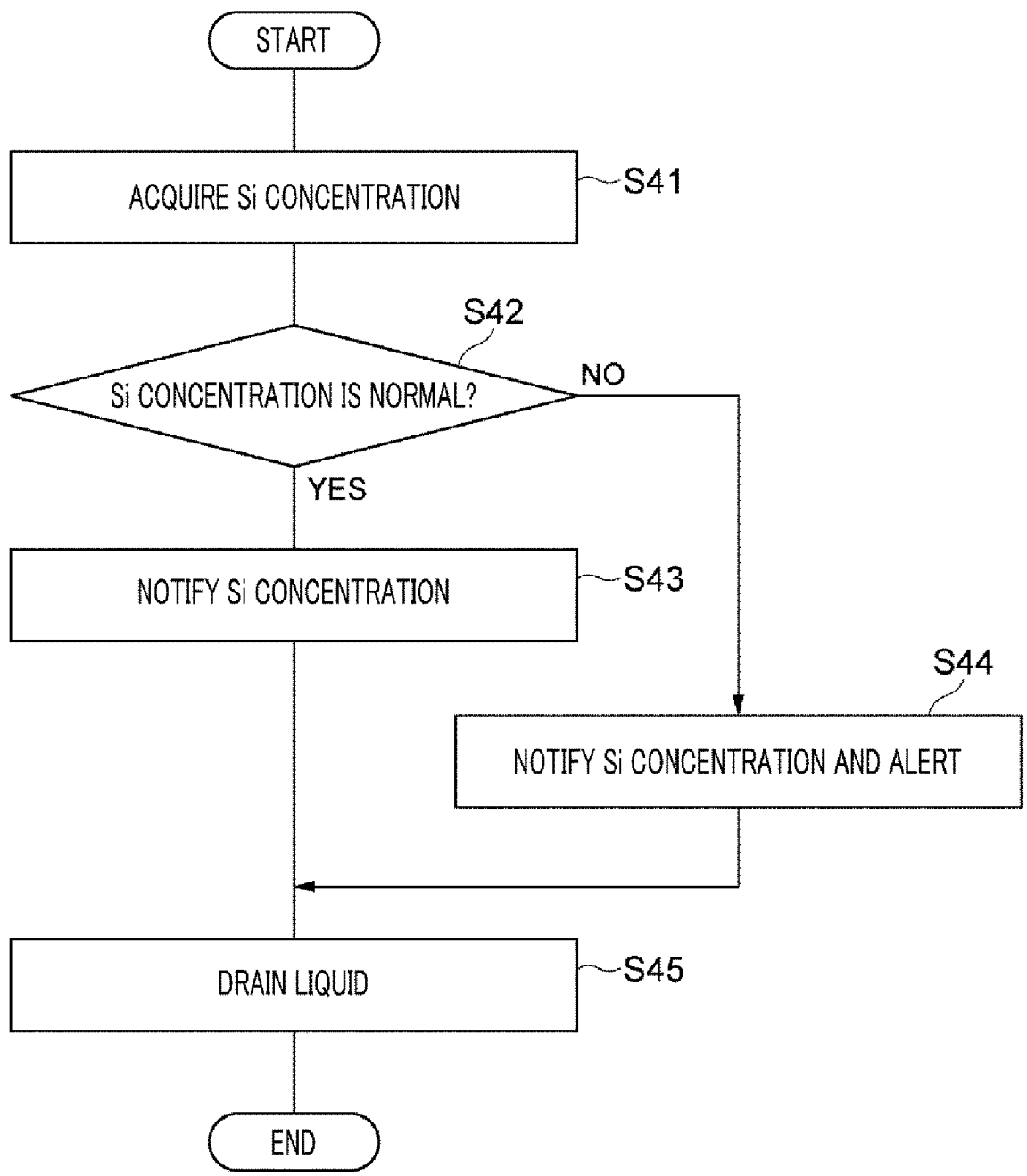
FIG. 10 is a flowchart for describing a sequence of a concentration analyzing processing.

Now, the detailed sequence of the concentration analyzing processing in the process S4 will be explained in detail. As shown in FIG. 10, the control unit 70 first performs a process S41. In the process S41, the analyzing unit 74 acquires the silicon concentration (Si concentration) from the analyzing apparatus 69.

Then, the control unit 70 performs a process S42. In the process S42, the analyzing unit 74 determines whether the silicon concentration is of a normal value (within a normal range).

If it is determined in the process S42 that the silicon concentration is of the normal value, the control unit 70 performs a process S43. In the process S43, the analyzing unit 74 notifies the control unit 7 with the silicon concentration.

Meanwhile, if it is found out in the process S42 that the silicon concentration is not of the normal value, the control unit 70 performs a process S44. In the process S44, the analyzing apparatus 74 notifies the control unit 7 with an alert (information indicating the abnormality).

After the process S43 or the process S44 is performed, the control unit 70 carries out a process S45. In the process S45, the analyzing unit 74 is controlled to drain the diluted solution after being subjected to the concentration measurement in the analyzing apparatus 69 by opening the valve 95B of the pipeline 95A, and is controlled to drain the diluted solution remaining in the dilution tank 68 by opening the valve 88B of the pipeline 88A. Then, the concentration analyzing processing (process S4) is completed.

(Sequence of Cleaning Processing)

Figure 11:
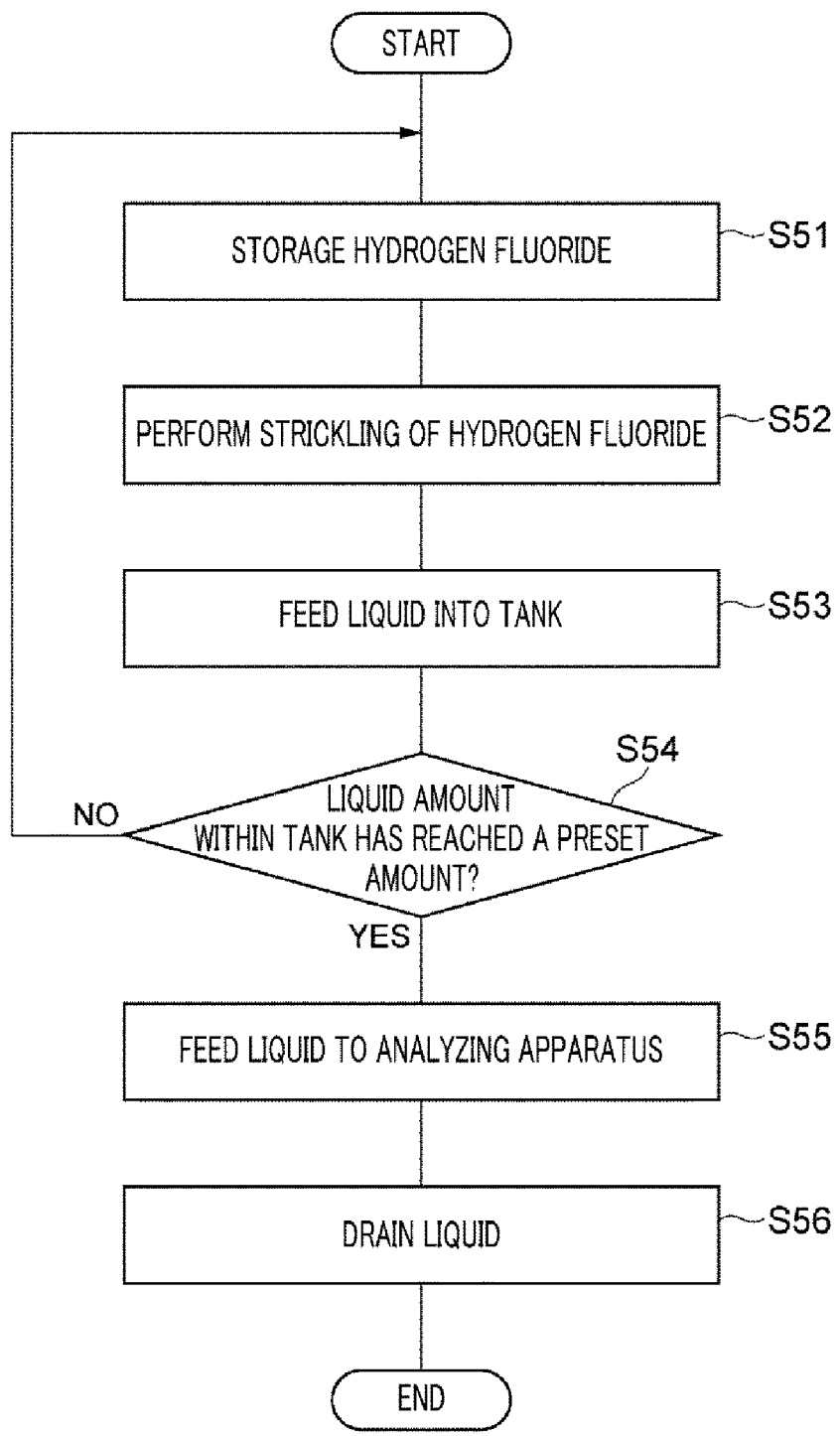
FIG. 11 is a flowchart for describing a sequence of a cleaning processing.

Now, the detailed sequence of the cleaning processing in the process S5 will be explained. As depicted in FIG. 11, the control unit 70 first performs a process S51. In the process S51, the cleaning control unit 75 opens the valve 96B of the pipeline 96A in the state that the first valve 81 and the second valve 82 are closed and the third valve 83 is opened, so that the hydrogen fluoride is stored in the storage line 61.

Thereafter, the control unit 70 performs a process S52. In the process S52, the cleaning control unit 75 controls the first supply unit 65A to supply the nitrogen gas into the storage line 61, so that the hydrogen fluoride stored in the storage line 61 is strickled and flown to the reception line 64.

Afterwards, the control unit 70 performs a process S53. In the process S53, the cleaning control unit 75 controls the second supply unit 65B to press the hydrogen fluoride within the storage line 61 toward the discharge line 63 by supplying the nitrogen gas into the storage line 61 after closing the third valve 83 and opening the second valve 82. Accordingly, the hydrogen fluoride within the storage line 61 is introduced into the dilution tank 68 through the discharge line 63.

Subsequently, the control unit 70 performs a process S54. In the process S54, the cleaning control unit 75 determines whether a liquid amount of the hydrogen fluoride within the dilution tank 68 has reached a preset amount.

If it is determined in the process S54 that the liquid amount has not reached the preset amount, the process S51 is performed again. Meanwhile, if it is determined in the process S54 that the liquid amount has reached the preset amount, the control unit 70 performs a process S55. In the process S55, the cleaning control unit 75 controls such that the diluted hydrogen fluoride stored in the dilution tank 68 is pressed toward the analyzing apparatus 69.

Finally, the control unit 70 performs a process S56. In the process S56, the cleaning control unit 75 controls such that the diluted hydrogen fluoride is drained. That is, after a sufficient amount of the diluted hydrogen fluoride is supplied to the analyzing apparatus 69, the cleaning control unit 75 controls such that the diluted hydrogen fluoride remaining in the dilution tank 68 is drained by opening the valve 88B of the pipeline 88A, and controls such that the diluted hydrogen fluoride in the analyzing apparatus 69 is drained by opening the valve 95B of the pipeline 95A.

<Effects of Exemplary Embodiment>

In the above-described substrate liquid processing apparatus, when measuring the silicon concentration in the phosphoric acid aqueous solution used as the processing liquid, it is required to supply the sufficiently diluted processing liquid to the analyzing apparatus configured to measure the concentration. To measure the silicon concentration accurately in the analyzing apparatus, the dilution ratio needs to have high reproduction accuracy. Further, since the phosphoric acid aqueous solution as a target of sampling is of a high temperature (e.g., 165° C.), if the liquid temperature is decreased greatly until this phosphoric acid aqueous solution is diluted, the silicon dissolved in the phosphoric acid aqueous solution may be precipitated, so that an adverse influence on the accuracy of the concentration measurement may occur. Thus, the phosphoric acid aqueous solution need not be cooled. In consideration of this, in the substrate liquid processing apparatus, it is important to supply the processing liquid in a constant amount with high accuracy under the high temperature environment.

In this regard, the substrate liquid processing apparatus A1 including the weighing apparatus 58 is equipped with the storage line 61 configured to store the processing liquid; the introduction line 62 configured to introduce the processing liquid into the storage line 61; the discharge line 63 configured to discharge the processing liquid from the storage line 61; and the gas supply unit 65 configured to perform the strickling of the processing liquid by jetting the gas to the surface of the processing liquid stored in the storage line 61.

According to this substrate liquid processing apparatus A1, the gas is jetted to the surface of the processing liquid in the storage line 61 in which the processing liquid introduced from the introduction line 62 is stored, so that the strickling of the processing liquid is performed. As a way to weigh the processing liquid, a method using a flow meter, a method using a suction technique such as a pipette, a method using a pump, or the like may be considered. In case of using the flow meter, however, a variation of a flow rate in a moving-up/down period of the device is large. Thus, weighing accuracy of a small amount of the processing liquid may not be guaranteed. Furthermore, in case of using the suction technique such as the pipette, it may also be difficult to achieve the weighing accuracy of the small amount of the processing liquid due to an influence of a surface tension. Further, in case of using the pump or the like, since there are many restrictions in consideration of a cost or an applicable temperature range, the weighing accuracy may not be guaranteed. Meanwhile, according to the substrate liquid processing apparatus A1 of the present exemplary embodiment, the processing liquid is weighed through the strickling by jetting the gas thereto. In this method of jetting the gas, since the weighing is performed without directly contacting with the processing liquid as a target of the weighing, the surface tension of the liquid surface would not be a problem. Furthermore, since the weighing is performed without using the flow meter or the pump, the aforementioned variation of the flow rate in the moving-up period of the device or the temperature range would not be a problem. Besides, in the substrate liquid processing apparatus A1 according to the present exemplary embodiment, the processing liquid after being subjected to the weighing can be discharged from the discharge line 63. As stated above, according to the substrate liquid processing apparatus A1 of the present exemplary embodiment, it is possible to weigh the small amount of the processing liquid with high accuracy.

Further, as described above, since the pump or the like is not used in the substrate liquid processing apparatus A1, the weighing can be performed without being affected by the high temperature environment. That is, according to the substrate liquid processing apparatus A1, the processing liquid can be supplied in the constant amount with high accuracy in the high temperature environment.

The substrate liquid processing apparatus A1 is equipped with the reception line 64 configured to receive the processing liquid strickled by the gas supply unit 65. Accordingly, the strickled processing liquid and the weighed processing liquid (which is discharged to the dilution tank 68) can be appropriately distinguished. Thus, the strickled processing liquid can be securely drained through the reception line 64. Therefore, the weighing accuracy can be guaranteed.

The storage line 61 is vertically extended, and stores the processing liquid therein, and the reception line 64 is branched and extended from the storage line 61. Further, the introduction line 62 and the discharge line 63 are connected to the storage line 61 under the reception line 64, and the gas supply unit 65 performs the strickling of the processing liquid by supplying the nitrogen gas to the portion of the storage line 61 above the reception line 64. As the gas is supplied toward the upper portion of the storage line 61, the gas can be jetted to the surface of the processing liquid appropriately, and the processing liquid can be appropriately flown into the reception line 64 branched from the storage line 61. Further, since the reception line 64 is branched from the storage line 61, the processing liquid exceeding the preset storage amount is easily allowed to be flown to the reception line 64, so that the weighing accuracy can be further improved.

The introduction line 62 is provided under the discharge line 63. By way of example, if the introduction line is provided above the discharge line, a part of the processing liquid introduced into the storage line from the introduction line might be flown to the downside (toward the discharge line). In this case, the weighing cannot be performed appropriately, so that the processing liquid may not be supplied in the constant amount accurately. Since, however, the introduction line 62 is provided under the discharge line 63, it may be difficult for the processing liquid to flow to the discharge line 63 when the processing liquid is introduced into the storage line 61 from the introduction line 62. Therefore, the weighing accuracy can be guaranteed.

Further, there are provided the first valve 81 configured to adjust the flow of the processing liquid in the introduction line 62; the second valve 82 configured to adjust the flow of the processing liquid in the discharge line 63; the third valve 83 configured to adjust the flow of the processing liquid in the reception line 64; and the control unit 70. The control unit 70 performs the storage control of storing the processing liquid introduced from the introduction line 62 in the storage line 61 by opening the first valve 81 and the third valve 83 while closing the second valve 82; and performs the strickling control of closing, after the storage control, the first valve 81 and controlling the gas supply unit 65 such that the processing liquid is strickled by jetting the nitrogen gas into the storage line 61. Through these controls, the strickling of the processing liquid can be appropriately performed after the storage of the processing liquid, so that the weighing accuracy can be guaranteed.

The control unit 70 may be configured to additionally perform, after the strickling control, the liquid feed control of closing the third valve 83 and opening the second valve 82, and controlling the gas supply unit 65 such that he processing liquid within the storage line 61 is pressed toward the discharge line 63 by jetting the nitrogen gas into the storage line 61. Accordingly, after the strickling of the processing liquid, the nitrogen gas supplied for the strickling can be used as a gas for discharging the processing liquid into the discharge line 63 from the storage line 61. Thus, the supply of the processing liquid in the constant amount can be carried out with this simple mechanism.

The proximity sensor 90, which is provided at the storage line 61 and configured to detect that the processing liquid has reached the target storage amount, is further provided. The control unit 70 ends the storage control if it is detected by the proximity sensor 90 that the processing liquid has reached the target storage amount. Accordingly, by way of example, the target storage amount may be set to be equal to or larger than an amount of the processing liquid discharged from the discharge line 63, and the strickling control may be performed after the target storage amount is obtained. That is, the strickling control can be performed after the processing liquid is stored in an enough amount to start the strickling control, so that the required weighing can be performed securely.

If it is not detected by the proximity sensor 90 that the processing liquid has reached the target storage amount after a lapse of the preset storage time, the control unit 70 makes a determination that an abnormal state has occurred. A flow rate of the processing liquid introduced into the storage line 61 from the introduction line 62 in a preset time can be estimated in advance. Thus, if it is not detected by the proximity sensor 90 that the processing liquid has reached the target storage amount even after the lapse of the preset storage time during which the processing liquid can reach the target storage amount, it might be deemed that there has occurred a problem in the configuration for storing the processing liquid. Therefore, in such a case, by making the determination of the abnormality, the problem in the configuration for storing the processing liquid can be determined simply and accurately.

Further, the analyzing apparatus 69 configured to measure the concentration of the processing liquid is further provided. The introduction line 62 introduces the processing liquid as a target of the concentration measurement into the storage line 61, and the discharge line 63 discharges the processing liquid within the storage line 61 to the analyzing apparatus 69. The control unit 70 determines whether the concentration of the processing liquid measured by the analyzing apparatus 69 is of the preset normal value. If the measured concentration is not of the preset normal value, the control unit 70 is further configured to set forth an alert. Accordingly, in the configuration in which the concentration measurement of the processing liquid supplied in the constant amount is performed, it is possible to determine and notify appropriately that the concentration of the processing liquid is not of the normal value.

So far, the exemplary embodiment has been described. However, the present disclosure is not limited the exemplary embodiment, and various changes and modifications may be made without departing from the spirit and scope of the present disclosure. By way of example, in the substrate liquid processing apparatus A1, the storage line 61, the introduction line 62, the discharge line 63, the gas supply unit 65 and the control unit 70 are described to be provided for performing the strickling of the phosphoric acid aqueous solution (weighing of the phosphoric acid aqueous solution). However, the exemplary embodiment is not limited thereto, and the strickling (the weighing) by using the storage line and the others may be performed on the hydrogen fluoride and the water supplied to the dilution tank 68 in the same manner, for example.

Further, regarding the supply of the nitrogen gas by the gas supply unit 65, the first supply unit 65A and the second supply unit 65B are switched to be respectively operated in the strickling control and the liquid feed control. However, the exemplary embodiment is not limited thereto, and there may be adopted a configuration in which the nitrogen gas supply unit is not switched to be operated in both controls (that is, a configuration in which the nitrogen gas is supplied from a single nitrogen gas supply unit).

Further, though it has been described that the nitrogen gas is supplied from the gas supply unit 65, the exemplary embodiment is not limited thereto. The gas used in the above-described strickling control and the liquid feed control may be a gas besides the nitrogen gas.

Figure 12A:
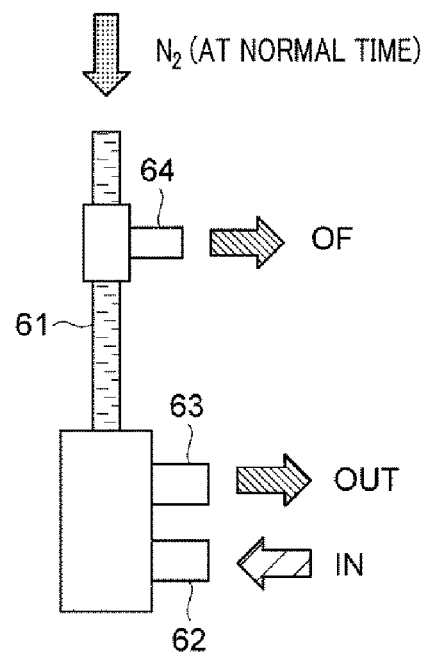
FIG. 12A and FIG. 12B are diagrams schematically illustrating a variation of a pipeline configuration.

Furthermore, the storage line 61, the introduction line 62, the discharge line 63 and the reception line 64 have been described as the pipeline configuration for performing the weighing of the processing liquid. However, the pipeline configuration for the weighing of the processing liquid may not be limited thereto. That is, in the above-described exemplary embodiment, the reception line 64 is branched from the storage line 61 vertically extended; the discharge line 63 is provided under the reception line 64; the introduction line 62 is provided under the discharge line 63 and the reception line 64; and the nitrogen gas is supplied from the portion of the storage line 61 above the reception line 64, as illustrated in FIG. 12A. However, the pipeline configuration for performing the weighing of the processing liquid is not limited thereto.

Figure 12B:
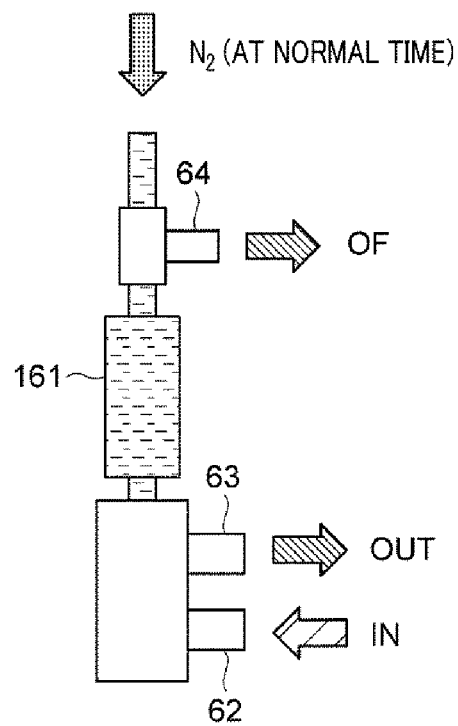

By way of example, as depicted in FIG. 12B, the weighing amount may be set to be larger by adopting a configuration in which a part of a storage line 161 has an enlarged diameter (for example, having a capacity 10 times larger than that of the storage line 61). Further, as shown in FIG. 13A and FIG. 13B, the nitrogen gas may be supplied by the gas supply unit from a direction intersecting the storage line 61. In this case, a gas supply unit 265 may be provided under the reception line 64 as depicted in FIG. 13A, or a gas supply unit 365 may be provided above the reception line 64 as depicted in FIG. 13B.

Figure 13C:
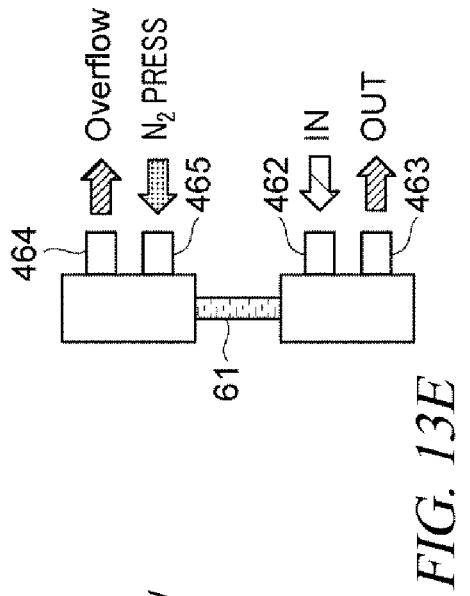
FIG. 13A to FIG. 13E are diagrams schematically illustrating a variation of the pipeline configuration.
Figure 13B:
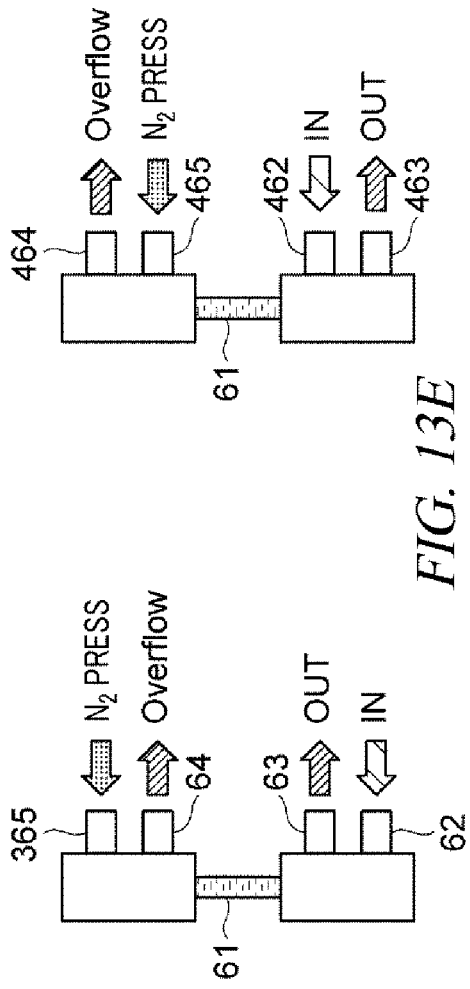
Figure 13A:
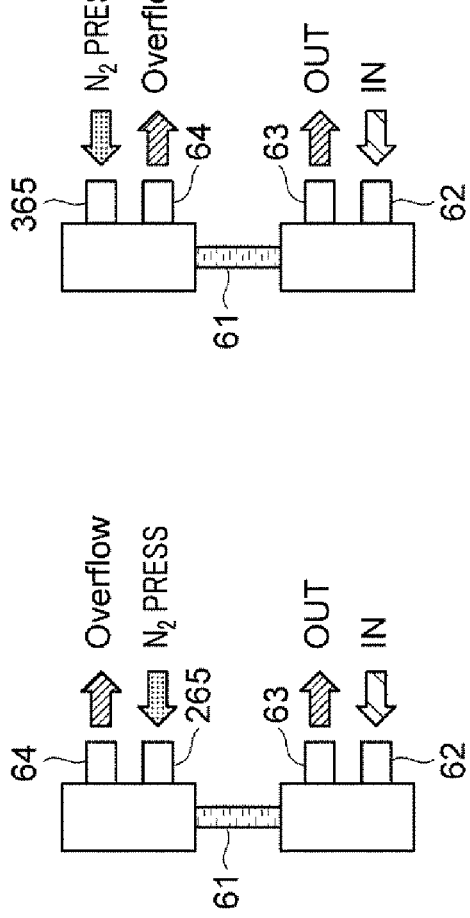
Figure 13E:
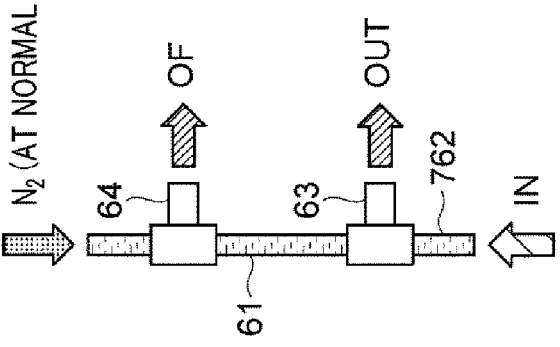
Figure 13D:
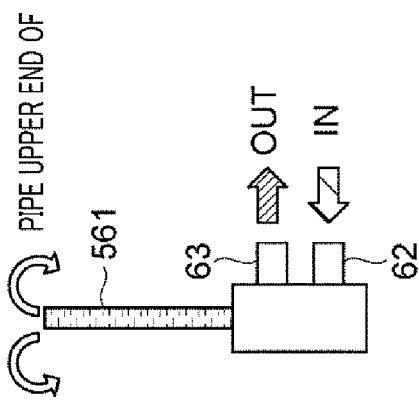

Moreover, as shown in FIG. 13C, an introduction line 462 may be provided above a discharge line 463. Further, as illustrated in FIG. 13D, there may be adopted a configuration in which the processing liquid is flown from an upper end of a storage line 561, for example, and a gas is supplied to a liquid surface within the storage line 561 from a gas supply unit (not shown) provided above the upper end of the storage line 561. Furthermore, as shown in FIG. 13E, an introduction line 762 may be continuous with the vertically extended storage line 61 in the vertical direction, and the processing liquid may be introduced into the storage line 61 from below.

Figure 14:
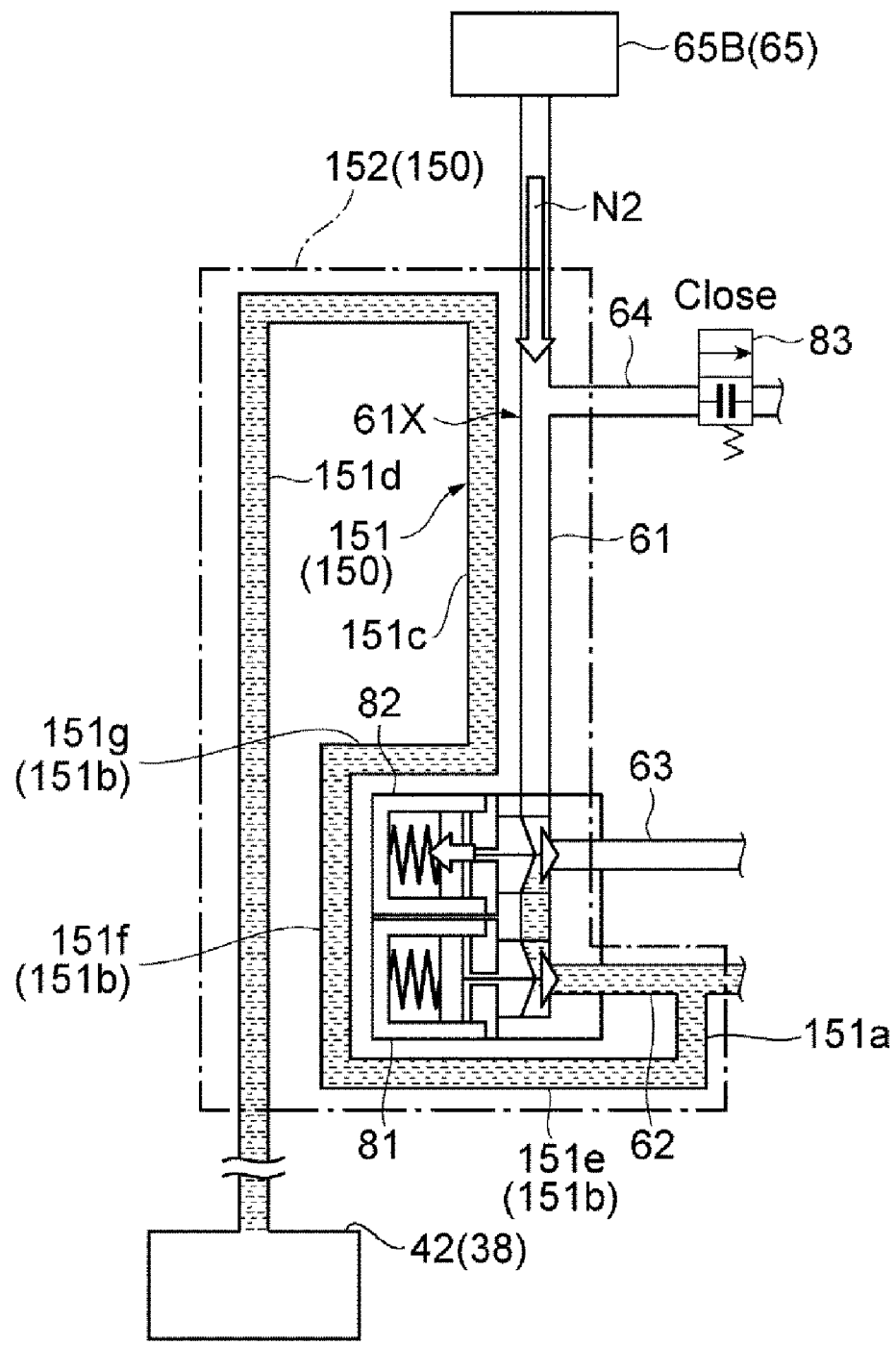
FIG. 14 is a diagram schematically illustrating a variation of the pipeline configuration.

Besides, as depicted in FIG. 14, the weighing apparatus may be further equipped with a heating unit 150 configured to heat the storage line 61 (storage unit). To elaborate, the heating unit 150 includes a circulation line 151 and a thermal insulator 152. The circulation line 151 is a pipeline which is branched from the introduction line 62 and extended along the storage line 61, and is connected to the outer tub 42 of the processing liquid storage unit 38 (processing liquid supply source). To be specific, the circulation line 151 has a first portion 151a, a second portion 151b, a third portion 151c and a fourth portion 151d.

The first portion 151a is a portion connected to the introduction line 62 to be branched therefrom. The first portion 151a is extended downwards from a connection point to the introduction line 62. The processing liquid flowing in the introduction line 62 is introduced into the circulation line 151 through the first portion 151a. The second portion 151b is continuous with a lower end of the first portion 151a and extended along the outline of the first valve 81 and the second valve 82. The second portion 151b has horizontal portions 151e and 151g extended horizontally and a vertical portion 151f extended vertically. The horizontal portion 151e is continuous with the lower end of the first portion 151a and horizontally extended to be substantially parallel with the introduction line 62. The horizontal portion 151e is horizontally extended up to a rear end of the first valve 81 (an end of the first valve 81 opposite to an end thereof connected to the storage line 61) along a bottom surface of the first valve 81. The vertical portion 151f is continuous with an end of the horizontal portion 151e (an end of the horizontal portion 151e opposite to an end thereof continuous with the lower end of the first portion 151a) and is extended upwards. The vertical portion 151f is vertically extended up to above the second valve 82 along lateral surfaces of the first valve 81 and the second valve 82. The horizontal portion 151g is continuous with an upper end of the vertical portion 151f and is extended horizontally. The horizontal portion 151g is horizontally extended up to a position adjacent to the storage line 61 along a top surface of the second valve 82.

The third portion 151c is continuous with an end of the horizontal portion 151g (an end of the horizontal portion 151g opposite to an end thereof continuous with the vertical portion 151f) and is extended upwards along the storage line 61. The third portion 151c is placed close to the storage line 61 so that the storage line 61 can be heated by the processing liquid of a high temperature flowing in the third portion 151c. The third portion 151c is extended up to, for example, above the connection point of the storage line 61 to the reception line 64. The fourth portion 151d is continuous with an upper end of the third portion 151c and extended to the outer tub 42 of the processing liquid storage unit 38 (processing liquid supply source).

The thermal insulator 152 is a heat insulating member provided along the storage line 61. By way of example, the thermal insulator 152 may be provided to surround the storage line 61 and the circulation line 151. The thermal insulator 152 needs to reduce heat transfer and may be made of, by way of non-limiting example, foamed resin.

By way of example, in case of weighing the processing liquid of a high temperature (e.g., 160° C. or thereabout) continually by using the storage line 61, the temperature of the storage line 61 is decreased in an interval period before a next weighing operation is performed, because the high-temperature processing liquid does not flow therein during this interval period. Here, the storage line 61 and the valves (the first valve 81, the second valve 82, etc.) of the pipelines continuous with the storage line 61 are thermally expanded depending on temperatures thereof, so that capacities thereof are changed. For this reason, the capacities of the storage line 61 and so forth may be different immediately after a long interval period (that is, in the state where the temperature is decreased) and after a sufficient time elapses from the long internal period (that is, in the state where the temperature is increased), so that it is difficult to weigh the processing liquid with high reproducibility. In the configuration where the heating unit 150 configured to heat the storage line 61 is provided as shown in FIG. 14, however, the temperature decrease of the storage line 161 and so forth can be effectively suppressed even in the long internal period. Therefore, it is possible to suppress the variation of the amount of the processing liquid, which is weighed in the storage line 61 depending on the weighing timing, so that the processing liquid can be weighed with high reproducibility.

As stated above, in the configuration shown in FIG. 14, the heating unit 150 has the circulation line 151 branched from the introduction line 62, extended along the storage line 61 and connected to the outer tub 42 of the processing liquid storage unit 38 (processing liquid supply source). The processing liquid continuously flows in the circulation line 151 connected to the introduction line 62. By way of example, by allowing the high-temperature processing liquid to be flown in the circulation line 151 continuously, the storage line 61 extended along the circulation line 151, the first valve 81 and the second valve 82 can be heated continuously. Accordingly, the temperature decrease of the storage line 61, the first valve 81 and the second valve 82 can be suppressed, so that the processing liquid can be weighed with high reproducibility. Furthermore, by using the circulation line 151 as a member configured to heat the storage line 61 and so forth, the equipment is simple and compact as compared to a case of providing a heater or the like, so that equipment cost can be reduced.

Furthermore, in the configuration shown in FIG. 14, the heating unit 150 has the thermal insulator 152 provided along the storage line 61. Accordingly, the temperature decrease of the storage line 61 and so forth can be more effectively suppressed with this simple configuration.

Figure 16:
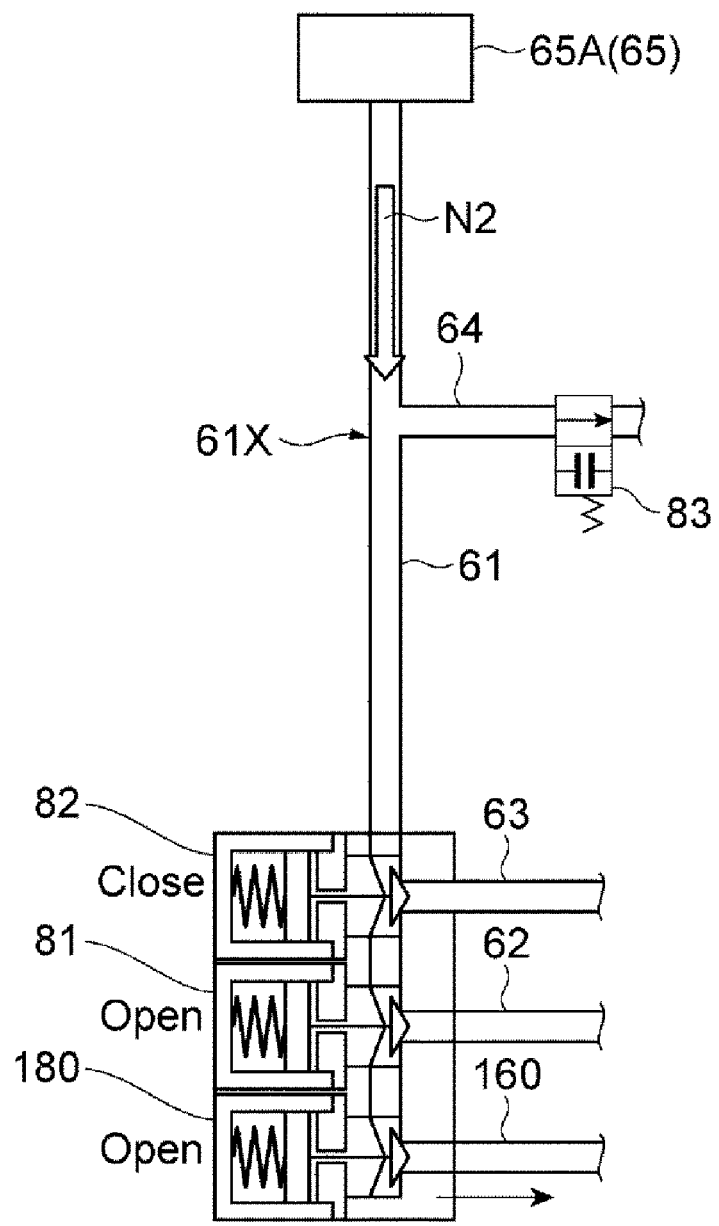
FIG. 16 is a diagram schematically illustrating a variation of the pipeline configuration.

Besides, as shown in FIG. 15A, FIG. 15B and FIG. 16, a drain line 160 connected to the storage line 61 under the introduction line 62 and configured to drain the processing liquid may be further provided. The drain line 160 is provided with a fourth valve 180 configured to adjust a flow of the processing liquid within the drain line 160.

Figure 17:
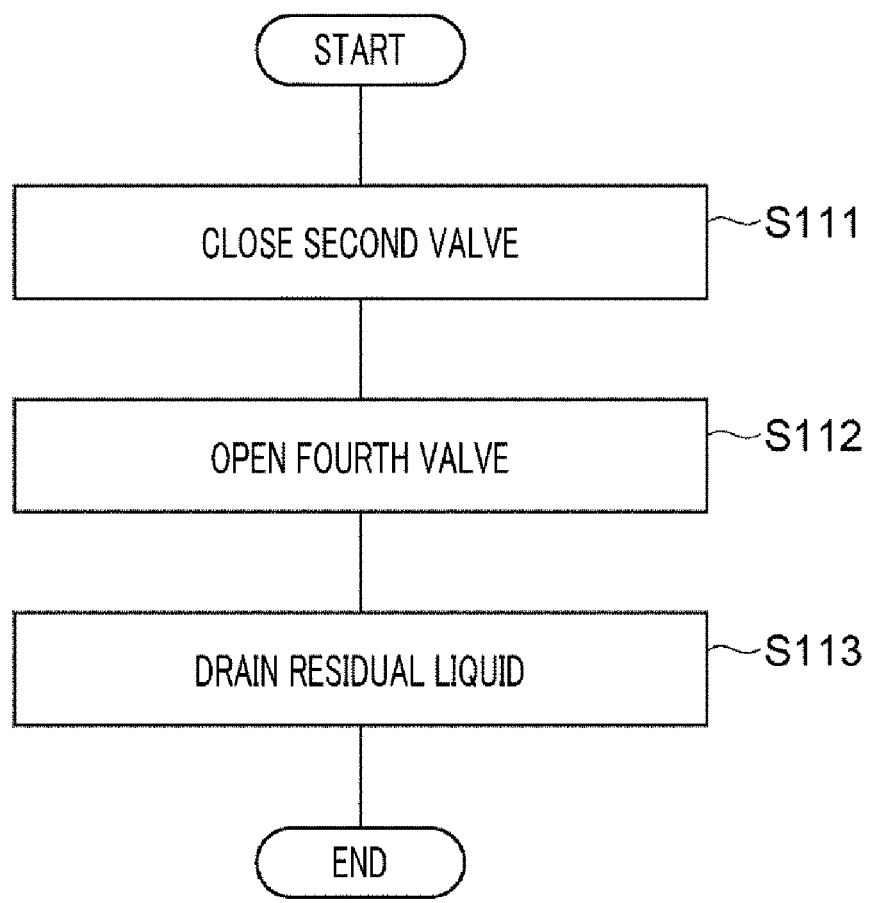
FIG. 17 is a flowchart for describing a sequence of a residual liquid draining processing.

In this configuration, after the liquid feed control of pressing the processing liquid within the storage line 61 toward the discharge line 63, the control unit 70 performs a drain control of draining (process S113) the residual liquid (details of this will be described later) by controlling the gas supply unit 65 to supply the nitrogen gas to the storage line 61 while closing the second valve 82 (process S111) and opening the fourth valve 180 (process S112), as depicted in FIG. 17.

FIG. 15A shows a state after the aforementioned liquid feed control. Before the liquid feed control, since the processing liquid is introduced into the storage line 61 from the introduction line 62, the processing liquid is stored in the introduction line 62 and a portion of the storage line 61 above the connection point to the introduction line 62. If the liquid feed control is completed, as shown in FIG. 15A, the processing liquid having existed above the connection point of the storage line 61 to the discharge line 63 is discharged to the discharge line 63, and the processing liquid is left between the connection point of the storage line 61 to the discharge line 63 and the connection point of the storage line 61 to the introduction line 62, within the introduction line 62 and in the valves (the first valve 81, the second valve 82, and so forth) corresponding to the respective pipelines (hereinafter, this left processing liquid may be referred to as "residual processing liquid" (residual liquid)). At the time when the liquid feed control is finished, as shown in FIG. 15A, the second valve 82 is opened, and the first valve 81 and the fourth valve 180 are closed.

From this state, if the aforementioned drain control is performed by the control unit 70 as shown in FIG. 15B, the second valve 82 is closed and the fourth valve 180 is opened, so that the drain line 160 is opened. As a result, the aforementioned residual processing liquid is drained through the drain line 160.

In a configuration where the drain line 160 is not provided, the residual processing liquid may not be sufficiently removed even through the cleaning processing performed afterwards. In this case, when the processing liquid is newly introduced from the introduction line 62, for example, the residual processing liquid may be mixed with the newly introduced processing liquid, so that the processing liquid may fail to have a required concentration. For example, when a high-concentration processing liquid and a low-concentration processing liquid are weighed alternately, the processing liquid may not have the required concentration. In the configuration where the drain line 160 connected to the storage line 61 under the introduction line 62 is provided, however, the aforementioned residual processing liquid can be appropriately drained out by opening the drain line 160. According to the configuration described so far, the newly introduced processing liquid and the residual processing liquid can be suppressed from being mixed, so that the concentration of the processing liquid supplied from the storage line 61 can be made to the required concentration. Further, even in case that the drain line 160 is not provided, for example, it may be possible to adopt a configuration in which the processing liquid, which does not have the required concentration due to the mixing, is not used by draining the processing liquid weighed at the first timing when the concentration is changed. Such a configuration, however, may have problems such as an increase of consumption amount of the processing liquid, an increase of a measurement time, and so forth. In the configuration where the drain line 160 is provided, however, these problems are not caused.

Moreover, as depicted in FIG. 16, the control unit 70 may perform an air removing control of removing air stagnant in the storage line 61 through the drain line 160 by opening the fourth valve 180 for a preset time when starting the storage control. That is, though the processing liquid is introduced from the introduction line 62 by opening the first valve 81 during the storage control, the air removing control may be performed by opening the fourth valve 180 in addition to the first valve 81 only for a preset time when starting the storage control. The control unit 70 closes the fourth valve 180 after the preset time elapses. When starting the storage control, the air exists in the storage line 61 as the valve is opened in the liquid feed control or the like. If the air exists in the storage line 61, the storage amount of the processing liquid within the storage line 61 may be changed. However, by removing the air through the drain line 160 by opening the fourth valve 180 of the drain line 160 when starting the storage control, the processing liquid can be stored in the storage control in the state that the air is not stagnant in the storage line 61. Thus, the processing liquid can be weighed with high reproducibility. Furthermore, the control unit 70 may allow the processing liquid remaining in the introduction line 62 to be drained through the drain line 160 by setting a processing time of the aforementioned air removing control (a time during which the fourth valve 180 is opened) to be long.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A weighing apparatus, comprising:
a storage line configured to store a processing liquid therein;
an introduction unit, including an introduction line, configured to introduce the processing liquid into the storage line;
a discharge unit, including a discharge line, configured to discharge the processing liquid from the storage line;
a reception line branched from and extended from the storage line in a direction orthogonal to the storage line;
a gas supply unit configured to jet a gas from one end of the storage line toward a surface of the processing liquid stored within the storage line in order to press the processing liquid so as to remove an excess target storage amount of the processing liquid by flowing the processing liquid, stored in a portion of the storage line to which the reception line is connected, toward the reception line;
a first valve configured to adjust a flow of the processing liquid in the introduction line;
a second valve configured to adjust a flow of the processing liquid in the discharge line;
a third valve configured to adjust a flow of the processing liquid in the reception line; and
a control unit,
wherein the control unit is configured to perform:
a storage control of storing the processing liquid introduced from the introduction line in the storage line by opening the first valve and the third valve while closing the second valve; and
an excess target storage amount removal control of controlling, after the storage control, the gas supply unit to perform the excess target storage amount removal of the processing liquid by closing the first valve and jetting the gas into the storage line while the third valve remains open.

2. The weighing apparatus of claim 1, wherein
the reception line is configured to receive the processing liquid on which the excess target storage amount removal is performed by the gas supply unit.

3. The weighing apparatus of claim 2,
wherein the storage line is extended in an up-and-down direction,
the introduction line is connected to the storage line under the reception line,
the discharge line is connected to the storage line under the reception line, and
the gas supply unit performs the excess target storage amount removal of the processing liquid by jetting the gas to the portion of the storage line to which the reception line is connected.

4. The weighing apparatus of claim 3,
wherein the introduction line is provided under the discharge line.

5. The weighing apparatus of claim 1,
wherein the control unit further performs a liquid feed control of controlling, after the excess target storage amount removal control, the gas supply unit to press the processing liquid within the storage line toward the discharge line by jetting the gas into the storage line while closing the third valve and opening the second valve.

6. The weighing apparatus of claim 5, further comprising:
a drain line which is connected to the storage line under the introduction line and through which the processing liquid is drained.

7. The weighing apparatus of claim 6, further comprising:
a fourth valve configured to adjust a flow of the processing liquid within the drain line,
wherein the control unit is configured to further perform a drain control of controlling, after the liquid feed control, the gas supply unit to supply the gas into the storage line while closing the second valve and opening the fourth valve.

8. The weighing apparatus of claim 7,
wherein the control unit is configured to further perform, when starting the storage control, an air removing control of removing air stagnant in the storage line through the drain line by opening the fourth valve for a preset time.

9. The weighing apparatus of claim 1, further comprising:
a sensor provided at the storage line and configured to detect that the processing liquid reaches a preset storage amount,
wherein the control unit ends the storage control if it is detected by the sensor that the processing liquid has reached the storage amount.

10. The weighing apparatus of claim 9,
wherein the control unit makes a determination of an abnormal state when it is not detected by the sensor that the processing liquid has reached the storage amount after a preset storage time has elapsed.

11. The weighing apparatus of claim 1, further comprising:
a heating unit configured to heat the storage line.

12. The weighing apparatus of claim 11,
wherein the introduction unit comprises an introduction line through which the processing liquid supplied from a processing liquid supply source is introduced into the storage line,
the heating unit comprises a circulation line which is branched from the introduction line to be extended along the storage line and which is connected to the processing liquid supply source.

13. The weighing apparatus of claim 11,
wherein the heating unit further comprises a thermal insulator provided along the storage line.

14. A substrate liquid processing apparatus comprising:
a weighing apparatus as claimed in claim 1; and
wherein the introduction line introduces the processing liquid into the storage line,
the discharge line discharges the processing liquid within the storage line, and
the control unit obtains a concentration of the processing liquid by analyzing the processing liquid supplied through the discharge line and determines whether the concentration of the processing liquid is of a preset normal value, and provides an alert when the concentration is found not to be of the preset normal value.

\* \* \* \* \*

UNITED STATES PATENT AND TRADEMARK OFFICE
CERTIFICATE OF CORRECTION

PATENT NO. : 11,152,234 B2
APPLICATION NO. : 15/940036
DATED : October 19, 2021
INVENTOR(S) : Teruaki Konishi et al.

It is certified that error appears in the above-identified patent and that said Letters Patent is hereby corrected as shown below:

In the Specification

Column 6, Line 21, "88.3 6wt %" should be -- 88.3 wt% --.

Signed and Sealed this
Fifth Day of July, 2022

Katherine Kelly Vidal
*Director of the United States Patent and Trademark Office*